(12) United States Patent
Kim et al.

(10) Patent No.: US 12,069,894 B2
(45) Date of Patent: Aug. 20, 2024

(54) DISPLAY APPARATUS COMPRISING IRRADIATED REGIONS AND DAMS AND METHOD OF MANUFACTURING THE SAME

(71) Applicant: Samsung Display Co., Ltd., Yongin-si (KR)

(72) Inventors: Wonyong Kim, Yongin-si (KR); Jongki Kim, Yongin-si (KR); Gyoowan Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 463 days.

(21) Appl. No.: 17/455,631

(22) Filed: Nov. 18, 2021

(65) Prior Publication Data

US 2022/0216283 A1  Jul. 7, 2022

(30) Foreign Application Priority Data

Jan. 5, 2021  (KR) .......................... 10-2021-0000986

(51) Int. Cl.
*H10K 59/121* (2023.01)
*H10K 50/844* (2023.01)
*H10K 59/12* (2023.01)
*H10K 59/131* (2023.01)
*H10K 71/00* (2023.01)

(52) U.S. Cl.
CPC ....... *H10K 59/1213* (2023.02); *H10K 50/844* (2023.02); *H10K 59/1216* (2023.02); *H10K 59/131* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | |
|---|---|---|
| 8,421,347 B2 | 4/2013 | Yamagishi et al. |
| 8,993,443 B2 | 3/2015 | Song et al. |
| 10,135,010 B2 | 11/2018 | Kim et al. |

(Continued)

FOREIGN PATENT DOCUMENTS

| | | |
|---|---|---|
| CN | 109300957 A | 2/2019 |
| CN | 109817767 A | 5/2019 |

(Continued)

*Primary Examiner* — Nduka E Ojeh
(74) *Attorney, Agent, or Firm* — Lewis Roca Rothgerber Christie LLP

(57) ABSTRACT

A method of manufacturing the display apparatus, the method including preparing a substrate in which an opening area and a non-display area around at least a portion of the opening area are defined, forming, on the substrate, an insulating layer having an opening corresponding to the opening area and defining an irradiated region including a first area and a second area on the non-display area, forming a conductive pattern on the irradiated region, covering the first area, and exposing the second area, forming an organic material layer on the insulating layer and the conductive pattern, forming an electrode layer on the organic material layer, and removing, by irradiating a laser beam to the irradiated region, the conductive pattern, the organic material layer on the irradiated region, and the electrode layer on the irradiated region.

20 Claims, 20 Drawing Sheets

(56) References Cited

U.S. PATENT DOCUMENTS

| | | | |
|---|---|---|---|
| 10,840,317 | B2 | 11/2020 | Oh et al. |
| 11,716,878 | B2 * | 8/2023 | Kim ..................... H10K 59/131 257/40 |
| 2011/0316120 | A1 | 12/2011 | Rogers et al. |
| 2020/0105844 | A1 | 4/2020 | Wang et al. |
| 2020/0176519 | A1 | 6/2020 | Seo et al. |
| 2021/0305343 | A1 | 9/2021 | Oh et al. |
| 2022/0190289 | A1 * | 6/2022 | Ochi ..................... H10K 59/65 |

FOREIGN PATENT DOCUMENTS

| | | |
|---|---|---|
| CN | 110444125 A | 11/2019 |
| CN | 110649180 A | 1/2020 |
| JP | 6238141 B2 | 11/2017 |
| KR | 10-1705201 B1 | 2/2017 |
| KR | 10-2017-0045459 A | 4/2017 |
| KR | 10-2017-0081010 A | 7/2017 |
| KR | 10-1945260 B1 | 2/2019 |
| KR | 10-2020-0065185 A | 6/2020 |
| KR | 10-2020-0102580 A | 9/2020 |

* cited by examiner

DISPLAY APPARATUS COMPRISING IRRADIATED REGIONS AND DAMS AND METHOD OF MANUFACTURING THE SAME

CROSS-REFERENCE TO RELATED APPLICATION

This application claims priority to and the benefit of Korean Patent Application No. 10-2021-0000986, filed on Jan. 5, 2021, in the Korean Intellectual Property Office (KIPO), the entire content of which is incorporated by reference herein.

BACKGROUND

1. Field

One or more embodiments of the present disclosure relate to a display apparatus and a method of manufacturing the same.

2. Description of the Related Art

In recent years, the usage of display apparatuses has diversified. In addition, because the thickness and the weight of the display apparatuses are decreasing, the range of use thereof is widening.

Various functions for connecting or linking to display apparatuses have been added while the area occupied by a display area in such display apparatuses has increased. As a method of adding various functions while expanding the display area, research into using a portion of the display area for a function other than providing an image is ongoing.

SUMMARY

Aspects of one or more embodiments of the present disclosure are directed towards a display apparatus having at least one opening in a display area, and a method of manufacturing the same.

Additional aspects will be set forth in part in the description which follows and, in part, will be apparent from the description, or may be learned by practice of the presented embodiments of the present disclosure.

According to one or more embodiments of the present disclosure, a method of manufacturing a display apparatus includes preparing a substrate in which an opening area and a non-display area around (e.g., surrounding) at least a portion of the opening area are defined, forming, on the substrate, an insulating layer having an opening corresponding to the opening area and defining an irradiated region including a first area and a second area on the non-display area, forming a conductive pattern on the irradiated region of the insulating layer, covering the first area of the insulating layer, and exposing the second area of the insulating layer, forming an organic material layer on the insulating layer and the conductive pattern, forming an electrode layer on the organic material layer, and removing, by irradiating a laser beam to the irradiated region of the insulating layer, the conductive pattern, the organic material layer on the irradiated region, and the electrode layer on the irradiated region.

According to an example, the first area may include a plurality of line areas extending in a first direction and spaced from each other in a second direction. The second area may include a plurality of space areas extending in the first direction and spaced from each other in the second direction. The plurality of line areas and the plurality of space areas may be alternately arranged with each other along the second direction.

According to an example, the irradiated region may have a closed curve shape extending in the first direction in a plan view (e.g., on a plane).

According to an example, a planar shape of the irradiated region may be circular. The first direction may be a circumferential direction. The second direction may be a radial direction.

According to an example, the irradiated region may have a closed curve shape extending in the second direction in a plan view (e.g., on a plane).

According to an example, a planar shape of the irradiated region may be circular. The second direction may be a circumferential direction. The first direction may be a radial direction.

According to an example, the second area may include a plurality of dot areas surrounded by the first area. The conductive pattern may have a plurality of openings exposing the plurality of dot areas.

According to an example, a display area may be further defined on the substrate. The non-display area may be between the opening area and the display area. The method of manufacturing a display apparatus may further include forming, on the insulating layer, a pixel circuit including a transistor and a capacitor, forming a pixel electrode arranged on the display area and electrically connected to the pixel circuit, and forming the organic material layer on the pixel electrode.

According to an example, the pixel electrode and the conductive pattern may include a same conductive material by a same process.

According to an example, the irradiating the laser beam to the irradiated region of the insulating layer may include forming, in the organic material layer, a first opening exposing at least a portion of the insulating layer, and forming, in the electrode layer, a second opening corresponding to the first opening.

According to an example, the method of manufacturing a display apparatus may further include heat-treating the first area of the insulating layer.

According to an example, the irradiating the laser beam to the irradiated region of the insulating layer may be performed concurrently (e.g., simultaneously) with the heat-treating of the first area of the insulating layer.

According to an example, the method of manufacturing a display apparatus may further include forming, on the electrode layer, an encapsulation layer including an inorganic encapsulation layer and an organic encapsulation layer.

According to an example, the inorganic encapsulation layer may contact an upper surface of the irradiated region of the insulating layer and a sidewall of the organic material layer formed by removing the organic material layer on the irradiated region.

According to an example, the method of manufacturing a display apparatus may further include forming a plurality of dams arranged on the non-display area of the substrate, wherein the conductive pattern may be arranged between the plurality of dams.

According to one or more embodiments of the present disclosure, a display apparatus includes a substrate having an opening area, a display area around (e.g., surrounding) at least a portion of the opening area, and a non-display area between the opening area and the display area, an insulating layer on the substrate, having an opening corresponding to the opening area, and defining a plurality of irradiated regions and a plurality of dam regions on the non-display area, an organic material layer on the insulating layer and exposing at least a portion of each of the plurality of irradiated regions of the insulating layer; and a plurality of dams respectively arranged on the plurality of dam regions of the insulating layer. The plurality of irradiated regions and the plurality of dam regions extend in a first direction, and are alternately arranged with each other along a second direction crossing the first direction. Each of the plurality of irradiated regions includes a first area and a second area. The first area has a higher density of film than the second area by thermal conduction treatment.

According to an example, each of the plurality of irradiated regions and the plurality of dam regions may have a closed curve shape extending in the first direction in a plan view (e.g., on a plane).

According to an example, the first area may include a plurality of line areas extending in a third direction and spaced from each other in a fourth direction crossing the third direction. The second area may include a plurality of space areas extending in the third direction and spaced from each other in the fourth direction. The plurality of line areas and the plurality of space areas may be alternately arranged with each other along the fourth direction.

According to an example, the second area may include a plurality of dot areas surrounded by the first area.

According to an example, the insulating layer may have a trench corresponding to the first area.

These and/or other aspects will become apparent and more readily appreciated from the following description of the embodiments, taken in conjunction with the accompanying drawings.

These general and specific embodiments may be implemented by using a system, a method, a software (e.g., a computer program), or a combination thereof.

BRIEF DESCRIPTION OF THE DRAWINGS

The above and other aspects and features of certain embodiments of the present disclosure will be more apparent from the following description taken in conjunction with the accompanying drawings, in which.

DETAILED DESCRIPTION

Figure 1:
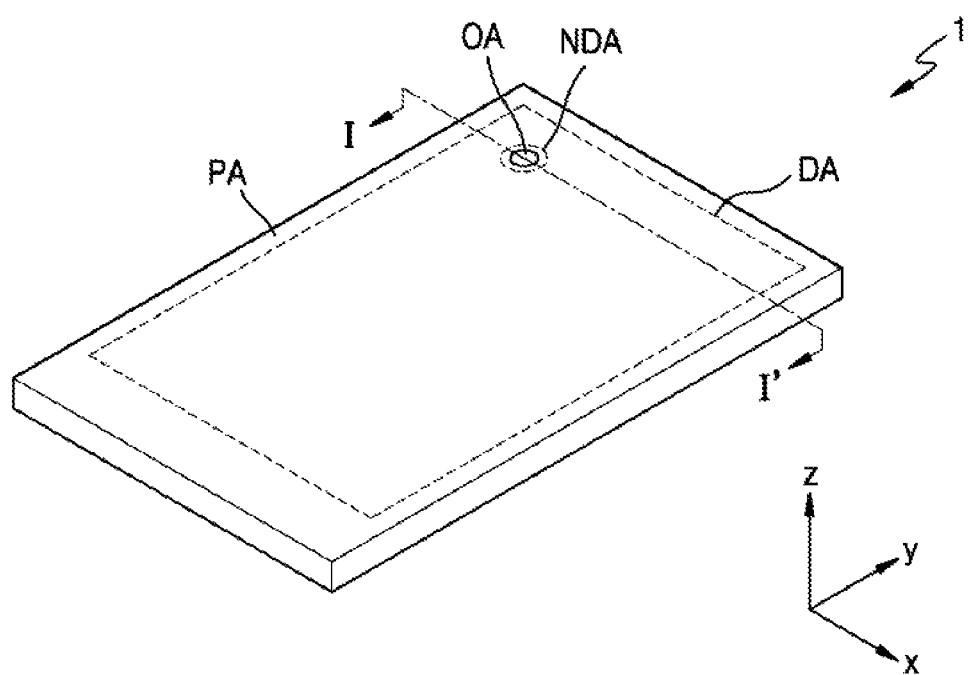
FIG. 1 is a perspective view of an electronic device according to an embodiment.

Reference will now be made in more detail to embodiments, examples of which are illustrated in the accompanying drawings. Like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

Because the present disclosure may have diverse modified embodiments, certain embodiments are illustrated in the drawings and are described in the detailed description. Advantages and features of the present disclosure, and implementation methods thereof will be clarified through following embodiments described with reference to the accompanying drawings. The d present disclosure may, however, be embodied in many different forms and should not be construed as limited to the embodiments set forth herein.

Hereinafter, embodiments of the present disclosure will be described in more detail with reference to the accompanying drawings. The same reference numerals are used to denote the same elements, and repeated descriptions thereof will be omitted.

It will be understood that although the terms "first," "second," etc. may be used herein to describe various elements, these elements should not be limited by these terms.

As used herein, the singular forms "a," "an," and "the" are intended to include the plural forms as well, unless the context clearly indicates otherwise.

An expression used in the singular encompasses the expression of the plural, unless it has a clearly different meaning in the context.

It will be further understood that the terms "includes," "including," "comprises" and/or "comprising" used herein specify the presence of stated features, steps, operations, elements, and/or components, but do not preclude the presence or addition of one or more other features, steps, operations, elements, components, and/or groups thereof.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

In the drawings, the relative sizes of elements, layers, and regions may be exaggerated and/or simplified for clarity.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the term "A and/or B" refers to the case of A or B, or A and B. In the specification, the term "at least one of A and B" refers to the case of A or B, or A and B.

It will be understood that when a layer, region, or component is connected to another portion, the layer, region, or component may be directly connected to the portion, and/or an intervening layer, region, or component may exist, such that the layer, region, or component may be indirectly connected to the portion. For example, when a layer, region, or component is electrically connected to another portion, the layer, region, or component may be directly electrically connected to the portion and/or may be indirectly connected to the portion through another layer, region, or component.

An x-axis, a y-axis and a z-axis are not limited to three axes of the rectangular coordinate system and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an electronic device 1 according to an embodiment.

Referring to FIG. 1, the electronic device 1 is a device that displays moving images or still images, and may be used as a display screen of various products such as a television, a laptop computer, a monitor, a billboard, and the Internet of Things (IoT) devices, as well as portable electronic devices such as a mobile phone, a smartphone, a tablet personal computer (PC), a mobile communication terminal, an electronic notebook, an e-book, a portable multimedia player (PMP), a navigation, and an ultra-mobile PC (UMPC).

In addition, the electronic device 1 according to an embodiment may be used in a wearable device such as a smart watch, a watch phone, a spectacle-type display, and a head mounted display (HMD).

The electronic device 1 according to another embodiment may be used as a dashboard of a vehicle, a center information display (CID) on a center fascia or a dashboard of a vehicle, a room mirror display that replaces side mirrors of a vehicle, and a display screen on a rear surface of a front seat as entertainment for a rear seat of a vehicle. In FIG. 1, for convenience of description, the electronic device 1 according to an embodiment is used as a smartphone.

The electronic device 1 may be formed in a rectangular shape in a plan view (e.g., on a plane defined by a ±x direction and a ±y direction). For example, the electronic device 1 may have a rectangular planar shape having a short side in a ±x direction and a long side in a ±y direction, as shown in FIG. 1. A corner where the short side in the ±x direction meets the long side in the ±y direction may be round (e.g., curved) to have a certain curvature or may be formed at a right angle. The planar shape of the electronic device 1 is not limited to a rectangle shape, and the electronic device 1 may be formed in a polygonal shape, an elliptical shape, or an irregular shape.

The electronic device 1 may include an opening area OA and a display area DA around (e.g., at least partially surrounding) the opening area OA. The electronic device 1 may include a non-display area NDA between the opening area OA and the display area DA, and a peripheral area PA around (e.g., at least partially surrounding) the display area DA.

The opening area OA may be located inside the display area DA. In an embodiment, the opening area OA may be on or at the upper left side of the display area DA, as shown in FIG. 1. Alternatively, the opening area OA may be variously arranged in a suitable manner, such as arranged in the center of the display area DA or at the upper right side of the display area DA. In a plan view of the present specification, "left", "right", "top", and "bottom" refer to directions when looking at the electronic device 1 from a vertical direction of the electronic device 1. For example, "left" refers to the −x direction, "right" refers to the +x direction, "up" refers to the +y direction, and "bottom" refers to the −y direction. In FIG. 1, one opening area OA is arranged, but as another embodiment, a plurality of opening areas OA may be provided.

Figure 2:
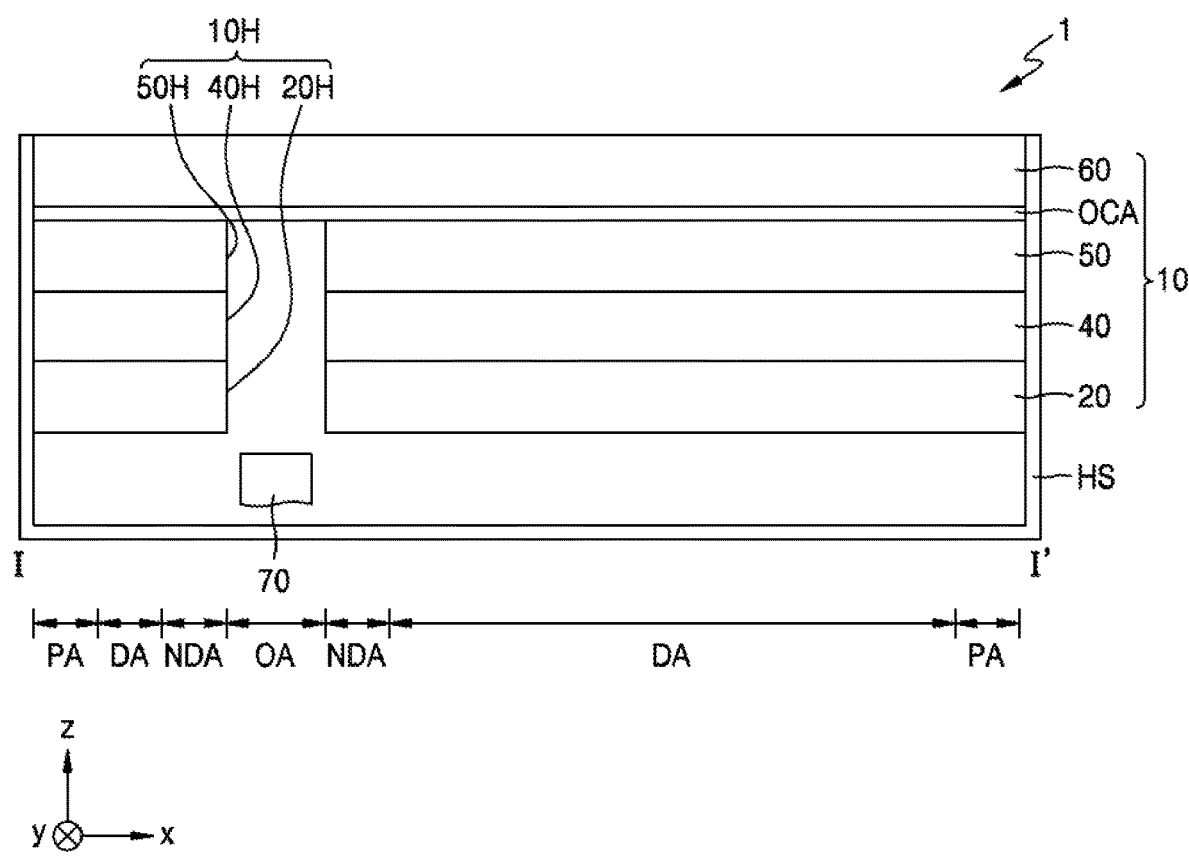
FIG. 2 is a cross-sectional view of the electronic device, taken along the line I-I' of FIG. 1.

FIG. 2 is a cross-sectional view of the electronic device 1, taken along the line I-I' of FIG. 1.

Referring to FIG. 2, the electronic device 1 may include a display apparatus 10 and a component 70 arranged in the opening area OA of the display apparatus 10. The display apparatus 10 and the component 70 may be accommodated in a housing HS.

The display apparatus 10 may include a display element layer 20, an input sensing layer 40, an optical functional layer 50, and a cover window 60.

The display element layer 20 may include display elements (or light-emitting elements) that emit light to display an image. The display elements may include a light-emitting diode, such as an organic light-emitting diode including an organic light-emitting layer.

In another embodiment, the light-emitting diode may be an inorganic light-emitting diode including an inorganic material. The inorganic light-emitting diode may include a PN junction diode including inorganic semiconductor-based materials. When a voltage is applied to the PN junction diode in the forward direction, holes and electrons are injected, and energy generated by recombination of the holes and electrons is converted into light energy to emit light of a certain color. The inorganic light-emitting diode may have a width of several micrometers to several hundred micrometers, and in some embodiments, the inorganic light-emitting diode may be referred to as a micro LED. In another embodiment, the display element layer 20 may include a quantum dot light-emitting diode.

That is, a light-emitting layer of the display element layer 20 may include organic materials, inorganic materials, quantum dots, organic materials and quantum dots, and/or inorganic materials and quantum dots.

The input sensing layer 40 may obtain coordinate information according to an external input, for example, a touch event. The input sensing layer 40 may include a sensing electrode (or a touch electrode) and trace lines connected to the sensing electrode. The input sensing layer 40 may be on the display element layer 20. The input sensing layer 40 may detect an external input using a mutual cap method (mutual capacitance method) and/or a self cap method (self capacitance method).

The input sensing layer 40 may be formed on (e.g., directly on) the display element layer 20 or may be formed separately and then coupled to the display element layer 20 through an adhesive layer such as optical clear adhesive (OCA). For example, the input sensing layer 40 may be continuously formed after the process of forming the display element layer 20 in which case the adhesive layer may not be between the input sensing layer 40 and the display element layer 20. Although FIG. 2 illustrates that the input sensing layer 40 is between the display element layer 20 and an optical functional layer 50, in another embodiment, the optical functional layer 50 may be between the display element layer 20 and the input sensing layer 40. In an embodiment, the input sensing layer 40 may be on the optical functional layer 50.

The optical functional layer 50 may include an antireflective layer. The antireflective layer may reduce the reflectance of light (e.g., external light) incident from the outside toward the display apparatus 10 through the cover window 60. The antireflective layer may include a retarder and a polarizer. The retarder may also be a film type (e.g., a film) or a liquid crystal coating type (e.g., a liquid crystal coating). The polarizer may also be of a film type (e.g., a film) or a liquid crystal coating type (e.g., a liquid crystal coating). A film-type polarizer may include a stretch-type synthetic resin film, and a liquid crystal coating type polarizer may include liquid crystals arranged in a certain arrangement.

In another embodiment, the antireflective layer may include a black matrix and color filters. The color filters may be arranged considering the color of light emitted from each of light-emitting diodes of the display element layer 20. In another embodiment, the antireflective layer may include a destructive interference structure. The destructive interference structure may include a first reflective layer and a second reflective layer on respective layers. First reflected light and second reflected light respectively reflected by the first reflective layer and second reflective layer may destructively interfere (e.g., destructively interfere with each other), and thus, external light reflectance may be reduced.

The optical functional layer 50 may include a lens layer. The lens layer may improve the luminous efficiency of light emitted from the display element layer 20 or may reduce color deviation. The lens layer may include a layer having a concave lens shape or a convex lens shape and/or may include a plurality of layers having different refractive indices from each other. The optical functional layer 50 may include all or any one of the above-described antireflective layer and lens layer.

The display apparatus 10 may include an opening 10H including a first opening 20H, a second opening 40H, and/or a third opening 50H. In this regard, FIG. 2 shows that the display element layer 20, the input sensing layer 40, and the optical functional layer 50 include first to third openings (a first opening 20H, a second opening 40H, and a third opening 50H), respectively, and the first to third openings 20H, 40H, and 50H overlap each other.

The first opening 20H may penetrate from an upper surface of the display element layer 20 to the bottom surface thereof, the second opening 40H may penetrate from an upper surface of the input sensing layer 40 to the bottom surface thereof, and the third opening 50H may penetrate from an upper surface of the optical functional layer 50 to the bottom surface thereof. For example, the first opening 20H may extend through the display element layer 20, the second opening 40H may extend through the input sensing layer 40, and the third opening 50H may extend through the optical functional layer 50.

The first to third openings 20H, 40H, and 50H of the opening 10H may overlap each other in the opening area OA. Two or more of the first to third openings 20H, 40H, and 50H may have the same size (or diameter) as each other. As another example, sizes (or diameters) of the first to third openings 20H, 40H, and 50H may be different from each other.

In another embodiment, at least one of the display element layer 20, the input sensing layer 40, and the optical functional layer 50 may not include an opening. For example, any one or two of the display element layer 20, the input sensing layer 40, and the optical functional layer 50 may not include an opening.

The cover window 60 may be on the optical functional layer 50. The cover window 60 may be coupled to the optical functional layer 50 through an adhesive layer such as an OCA therebetween. The cover window 60 may include a glass material or a plastic material. The plastic material may include polyethersulfone, polyacrylate, polyether imide, polyethylene naphthalate, polyethylene terephthalate, polyphenylene sulfide, polyarylate, polyimide, polycarbonate, or cellulose acetate propionate.

The cover window 60 may include a window having flexibility. For example, the cover window 60 may include a polyimide window or an ultra-thin glass window.

The opening area OA may be a kind of component area (e.g., a sensor area, a camera area, a speaker area, etc.) in which the component 70 for adding various suitable functions to the electronic device 1 is located. The component 70 may be arranged to overlap the opening 10H of the display apparatus 10.

The component 70 may include an electronic element. For example, the component 70 may be an electronic element using light or sound. For example, the electronic element may include a sensor that uses light such as an infrared sensor, a camera that captures an image by receiving light, a sensor that outputs and detects light or sound to measure a distance or recognize fingerprints, a small lamp that outputs light, a speaker that outputs sound, and the like.

An electronic element using light may use light of various suitable wavelength bands such as visible light, infrared light, and ultraviolet light. The opening area OA may be a transmission area through which light and/or sound that is output from the component 70 or traveling toward the electronic element from the outside may pass.

In another embodiment, when the electronic device 1 is used as a smart watch or a vehicle instrument panel, the component 70 may be a member including a clock needle or a needle indicating certain information (e.g., vehicle speed, etc.). In this case, the cover window 60 may include an opening located in the opening area OA unlike that shown in FIG. 2 so that the component 70 in a needle form may be exposed to the outside. However, the present disclosure is not limited thereto. For example, even when the electronic device 1 includes the component 70 such as a speaker, the cover window 60 may include an opening corresponding to the opening area OA.

Figure 3:
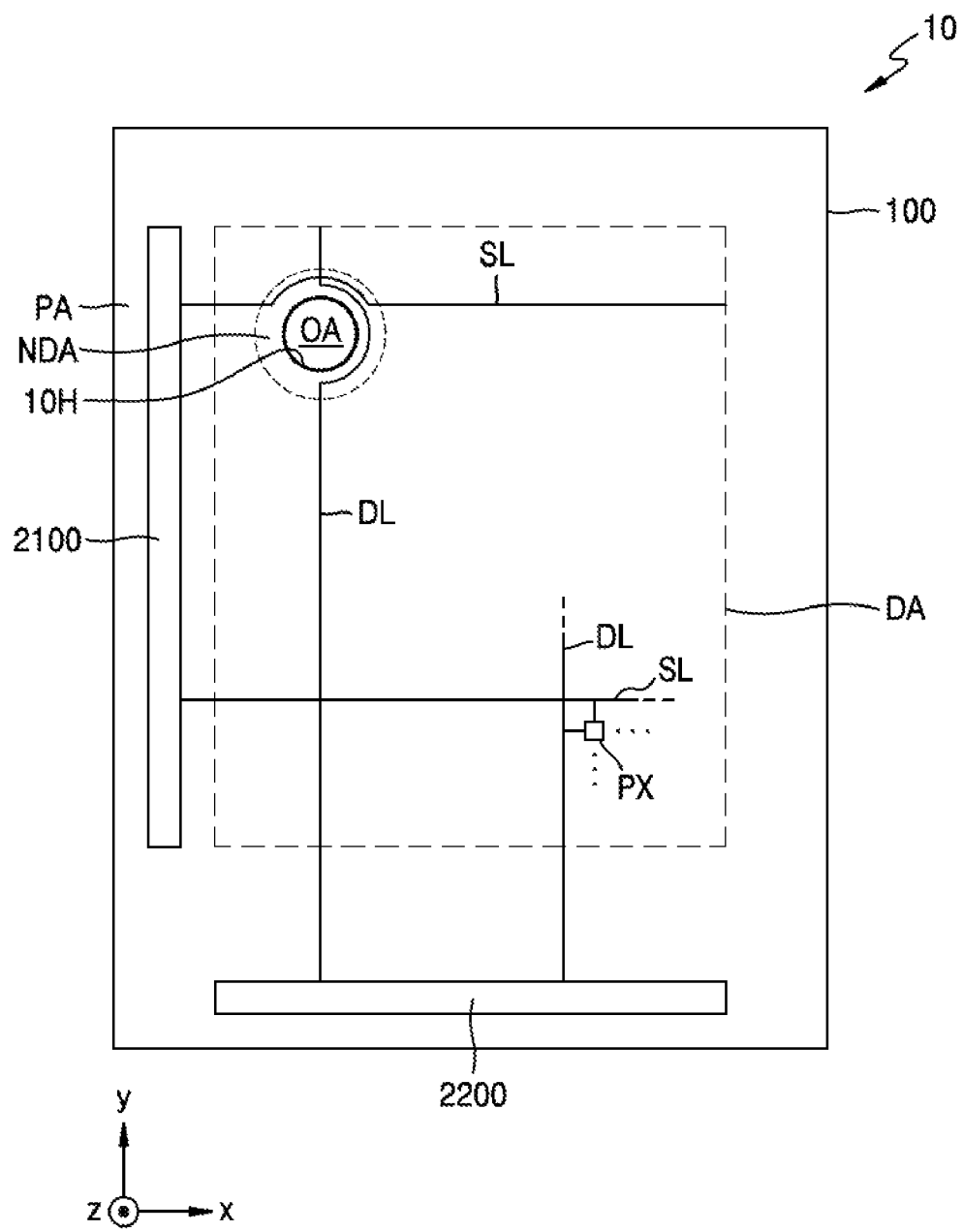
FIG. 3 is a plan view of a display apparatus according to an embodiment.

FIG. 3 is a plan view of a display apparatus according to an embodiment.

Referring to FIG. 3, the display apparatus 10 may include the opening area OA, the display area DA, the non-display area NDA, and the peripheral area PA. The display apparatus 10 may include a plurality of pixels PX arranged in the display area DA, and may display an image using light (e.g., a red light, a green light, and/or a blue light) emitted from a light emitting diode of each of the pixels PX.

Because the display apparatus 10 includes a substrate 100, it may be stated that the substrate 100 includes (or defines) the opening area OA, the display area DA, the non-display area NDA, and the peripheral area PA.

Figure 4:
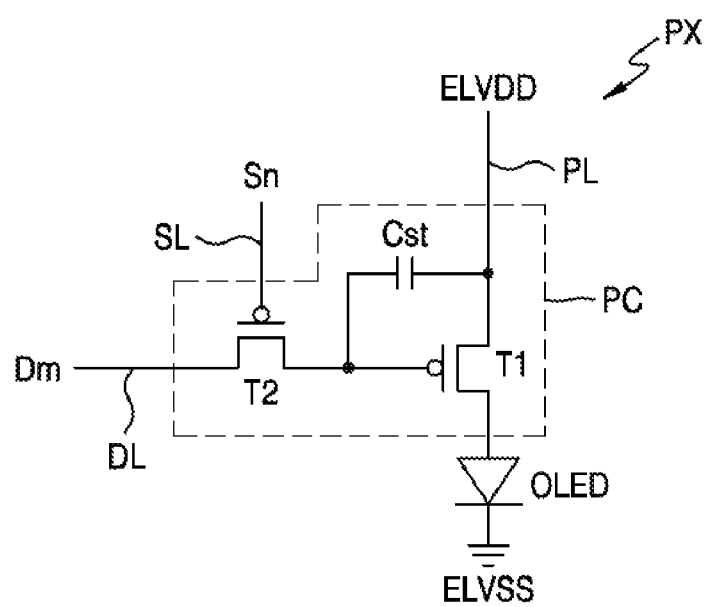
FIG. 4 is an equivalent circuit diagram of one pixel of a display apparatus according to an embodiment.

The light-emitting diode of each of the pixels PX may include an organic light-emitting diode OLED, as will be described below with reference to FIG. 4, and each organic light-emitting diode OLED may be connected (e.g., electrically connected) to a pixel circuit PC. FIG. 4 shows that a light-emitting diode includes the organic light-emitting diode OLED, and as another embodiment, as described above, the display apparatus 10 may include the inorganic light-emitting diode described above instead of the organic light-emitting diode OLED.

The non-display area NDA may be around (e.g., surround) at least a portion of the opening area OA. The non-display area NDA is an area in which no display elements such as an organic light-emitting diode are arranged. Trace lines that provide signals to the pixels PX provided around the opening area OA may pass through the non-display area NDA. For example, data lines DL and/or scan lines SL cross the display area DA in the ±y direction and/or the ±x direction, as shown in FIG. 3, but portions of the data lines DL and/or the scan lines SL may bypass the opening area OA by extending through the non-display area NDA along an edge of the opening 10H of the display apparatus 10 formed in the opening area OA.

A scan driver 2100 providing a scan signal to each pixel PX, a data driver 2200 providing a data signal to each pixel PX, and a first main power line and a second main power line for a driving voltage ELVDD (e.g., see FIG. 4) and a common voltage ELVSS (e.g., see FIG. 4), respectively, may be arranged in the peripheral area PA.

FIG. 3 shows that the data driver 2200 is adjacent to a side of the substrate 100. According to another embodiment, the data driver 2200 may be on a printed circuit board connected (e.g., electrically connected) to a pad on or at a side of the display apparatus 10. The printed circuit board may be flexible, and a portion of the printed circuit board may be bent to be located under or face a rear surface of the substrate 100.

FIG. 4 is an equivalent circuit diagram of one pixel of a display apparatus according to an embodiment.

Referring to FIG. 4, the pixel PX may include the pixel circuit PC connected to a scan line SL and a data line DL, and the organic light-emitting diode OLED connected to the pixel circuit PC.

The pixel circuit PC may include a driving transistor T1, a scan transistor T2, and a storage capacitor Cst. The driving transistor T1 and the scan transistor T2 may be thin film transistors.

The scan transistor T2 is connected to the scan line SL and the data line DL, and may transmit a data voltage Dm input through the data line DL to the driving transistor T1 in synchronization with a scan signal Sn input through the scan line SL.

The storage capacitor Cst is connected to the scan transistor T2 and a driving voltage line PL, and may store a voltage corresponding to a difference between the data voltage Dm received from scan transistor T2 and the driving voltage ELVDD supplied to the driving voltage line PL.

The driving transistor T1 is connected to the driving voltage line PL and the storage capacitor Cst, and may control a magnitude of a driving current flowing through the organic light-emitting diode OLED from the driving voltage line PL in response to a voltage value stored in the storage capacitor Cst. The organic light-emitting diode OLED may, according to the driving current, emit light with brightness or luminance corresponding to the magnitude of the driving current.

With reference to FIG. 4, an example in which the pixel circuit PC includes two transistors and one storage capacitor has been described, but the present disclosure is not limited thereto. For example, the pixel circuit PC may include three or more transistors and/or two or more storage capacitors. In an embodiment, the pixel circuit PC may include 7 transistors and 1 storage capacitor.

Figure 5A:
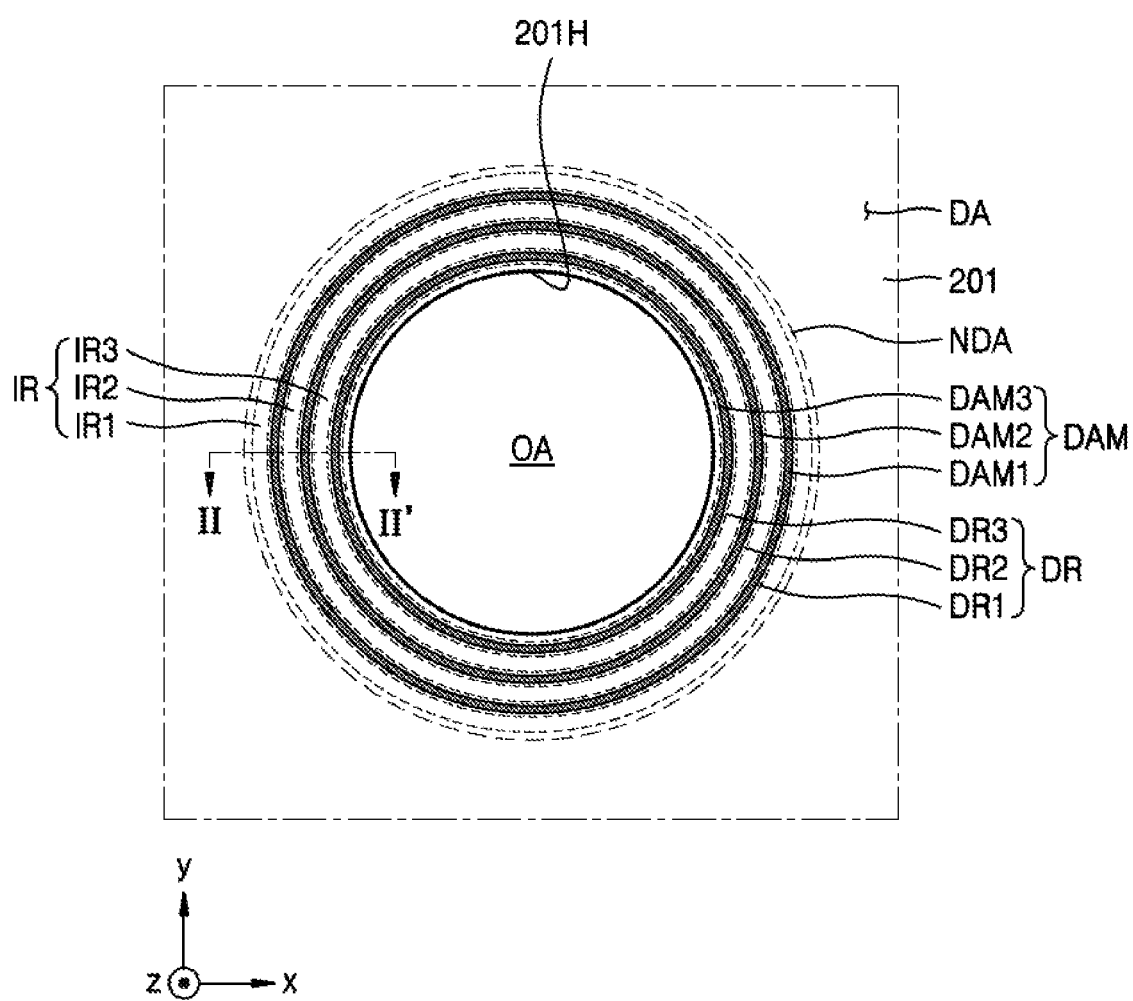
FIG. 5A is an enlarged plan view of a portion of a display apparatus according to an embodiment.
Figure 5B:
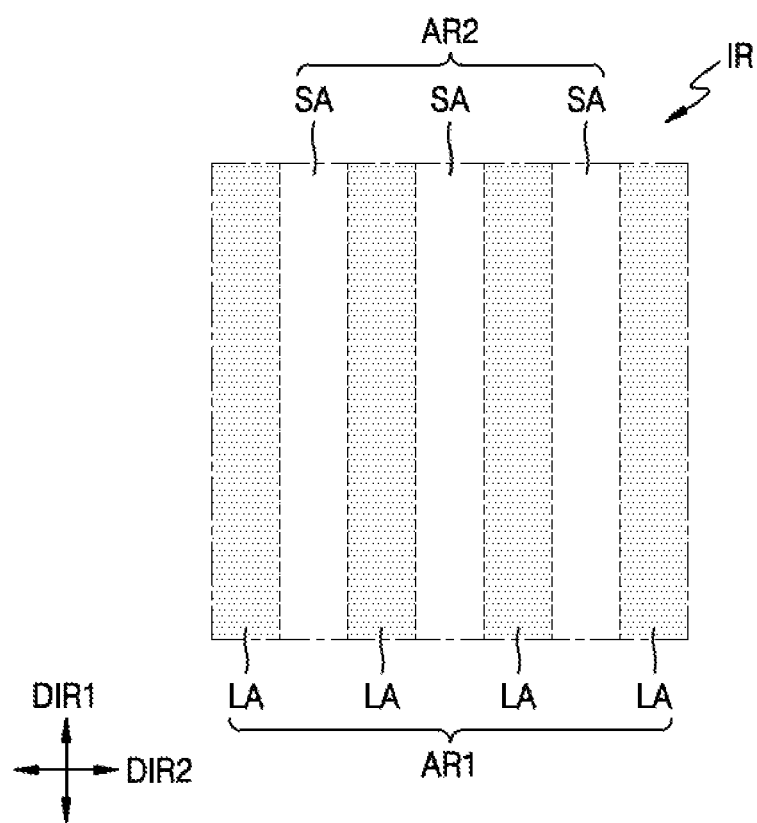
FIG. 5B is an enlarged plan view of a portion of FIG. 5A.

FIG. 5A is an enlarged plan view of a portion of a display apparatus according to an embodiment, and FIG. 5B is an enlarged plan view of a portion of FIG. 5A. In more detail, FIG. 5A is an enlarged view of an opening area of the display apparatus and a periphery of the opening area, and FIG. 5B is an enlarged view of a portion of an irradiated region of a non-display area.

Referring to FIG. 5A, the display apparatus 10 may include the opening area OA, the display area DA around (e.g., surrounding) the opening area OA, and the non-display area NDA between the open area OA and the display area DA. In FIG. 5A, the display area DA is shown around (e.g., surrounding) the entire outer periphery of the opening area OA, but the display area DA may be around (e.g., surround) a portion of the outer periphery of the opening area OA. That is, the display area DA may be around (e.g., surround) at least a portion of the opening area OA.

The display apparatus 10 may include an insulating layer 201. The insulating layer 201 may be on the substrate 100 (e.g., see FIG. 3). The insulating layer 201 may include an inorganic insulating material such as silicon nitride, silicon oxynitride, and silicon oxide, and may include a single layer or multiple layers including the inorganic insulating material described above. The insulating layer 201 may have an opening 201H corresponding to the opening area OA.

In an embodiment, the insulating layer 201 may include a plurality of irradiated regions IR on the non-display area NDA, and a plurality of dam regions DR on the non-display area NDA. The plurality of irradiated regions IR on the non-display area NDA and the plurality of dam regions DR on the non-display area NDA may be defined on the insulating layer 201. The irradiated regions IR may be areas to which a laser beam is irradiated, as shown in FIG. 11B to be described below.

FIG. 5A illustrates that respective widths of the irradiated regions IR and respective widths of the dam regions DR are the same, but as another example, respective widths of the irradiated regions IR and respective widths of the dam regions DR may be different from each other.

In addition, FIG. 5A illustrates three irradiated regions IR and three dam regions DR on the non-display area NDA, but the number of irradiated regions IR and dam regions DR may suitably vary. For example, the number of irradiated regions IR and the number of dam regions DR may be different from each other. For example, an irradiated region IR may be further defined between a third dam region DR3 and the opening area OA on the insulating layer 201, so that four irradiated regions IR and three dam regions DR may be included in the non-display area NDA. Therefore, in an embodiment, each of the plurality of dam regions DR may be between adjacent irradiated regions IR.

The irradiated regions IR and the dam regions DR may extend in a first direction DIR1 (e.g., see FIG. 5B). Each of the irradiated regions IR and the dam regions DR may have a closed curve shape extending in the first direction DIR1 in a plan view. For example, as shown in FIG. 5A, a planar shape of the irradiated region IR and a planar shape of the dam region DR may be circular (e.g., a donut shape). In this case, the first direction DIR1 may be a circumferential direction. FIG. 5A shows the planar shape of the irradiated region IR and the planar shape of the dam region DR in a circular shape, but the planar shape of the irradiated region IR and the planar shape of the dam region DR may be formed in a polygonal, elliptical, or irregular shape.

The irradiated regions IR and the dam regions DR may be alternately arranged with each other along a second direction DIR2 (e.g., see FIG. 5B). When the planar shape of the irradiated region IR and the planar shape of the dam region DR are circular, the second direction DIR2 may be a radial direction. For example, as shown in FIG. 5A, a first dam region DR1, which is one of the dam regions DR, may be between the first irradiated region IR1 and the second irradiated region IR2 adjacent to each other in the second direction DIR2 from among the irradiated regions IR. A second dam region DR2, which is one of the dam regions DR, may be between the second irradiated region IR2 and a third irradiated region IR3 adjacent to each other in the second direction DIR2 from among the irradiated regions IR. The third dam region DR3, which is one of the dam regions DR, may be between the third irradiated region IR3 and the opening area OA. In an embodiment, the irradiated regions IR and the dam regions DR may be spaced from each other in the second direction DIR2.

Referring to FIG. 5B in which a portion of the irradiated region IR is enlarged, the irradiated region IR may include a first area AR1 and a second area AR2. In this case, the first area AR1 may be a heat conduction-treated area. The first area AR1 (e.g., a portion of the insulating layer 201 corresponding to the first area AR1) may have different physical and/or chemical properties from the second area AR2 (e.g., a portion of the insulating layer 201 corresponding to the second area AR2) due to a heat or thermal conduction treatment. For example, an amount of hydrogen gas, an amount of carbon gas, or a density of film of the first area AR1 may be different from those of the second area AR2.

In an embodiment, because the first area AR1 is a heat conduction-treated area, the amount of hydrogen gas in the first area AR1 may be less than the amount of hydrogen gas in the second area AR2. Alternatively, the amount of carbon gas in the first area AR1 may be less than the amount of carbon gas in the second area AR2.

In another embodiment, the first area AR1 may have a higher density of film than that of the second area AR2 due to the heat conduction treatment. In this case, the insulating layer 201 may partially have a high film density, and may effectively block impurities or foreign materials introduced from the outside.

Figure 11A:
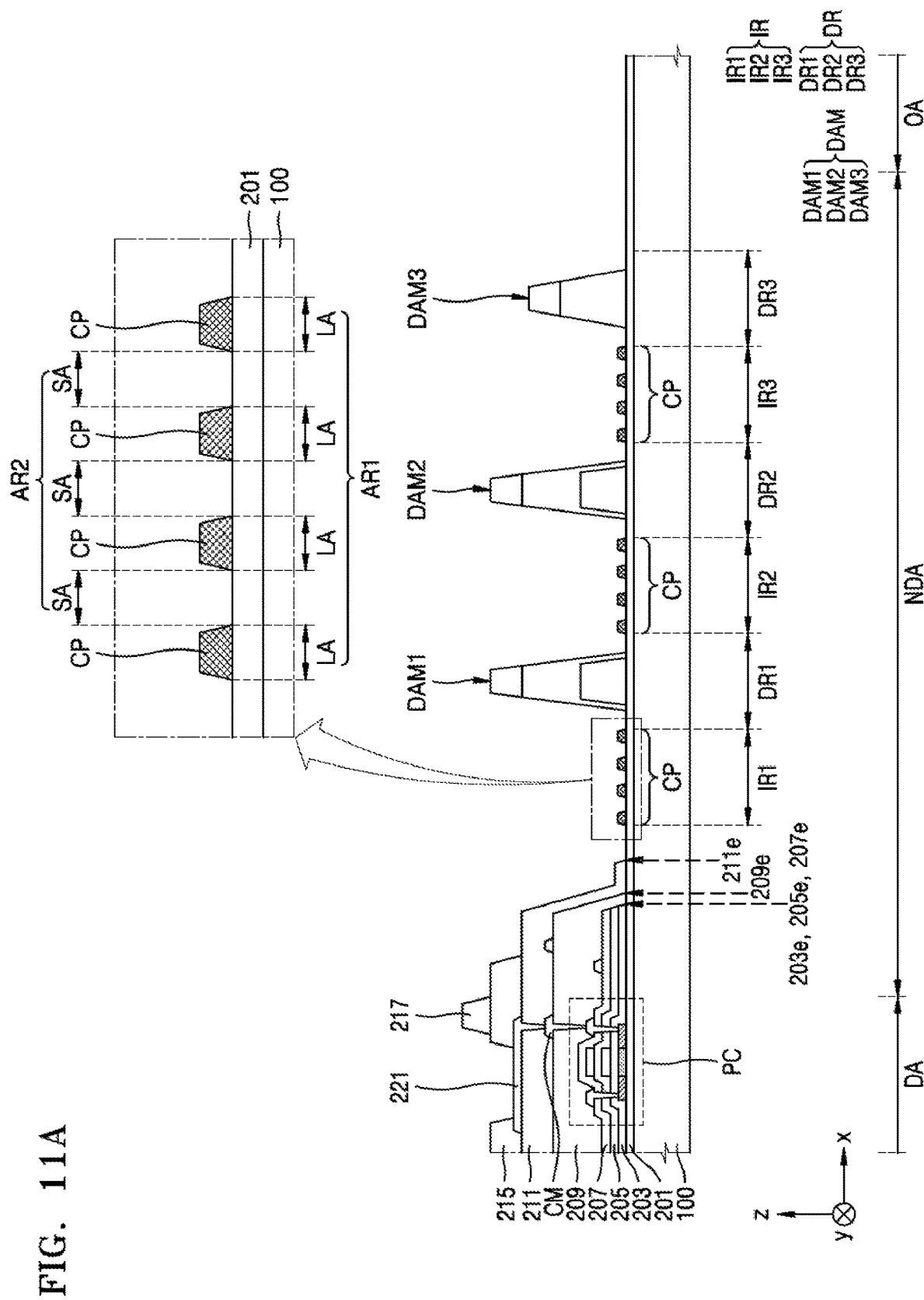
FIGS. 11A-11D are cross-sectional views sequentially illustrating a method of manufacturing a display apparatus, according to an embodiment.
Figure 11B:
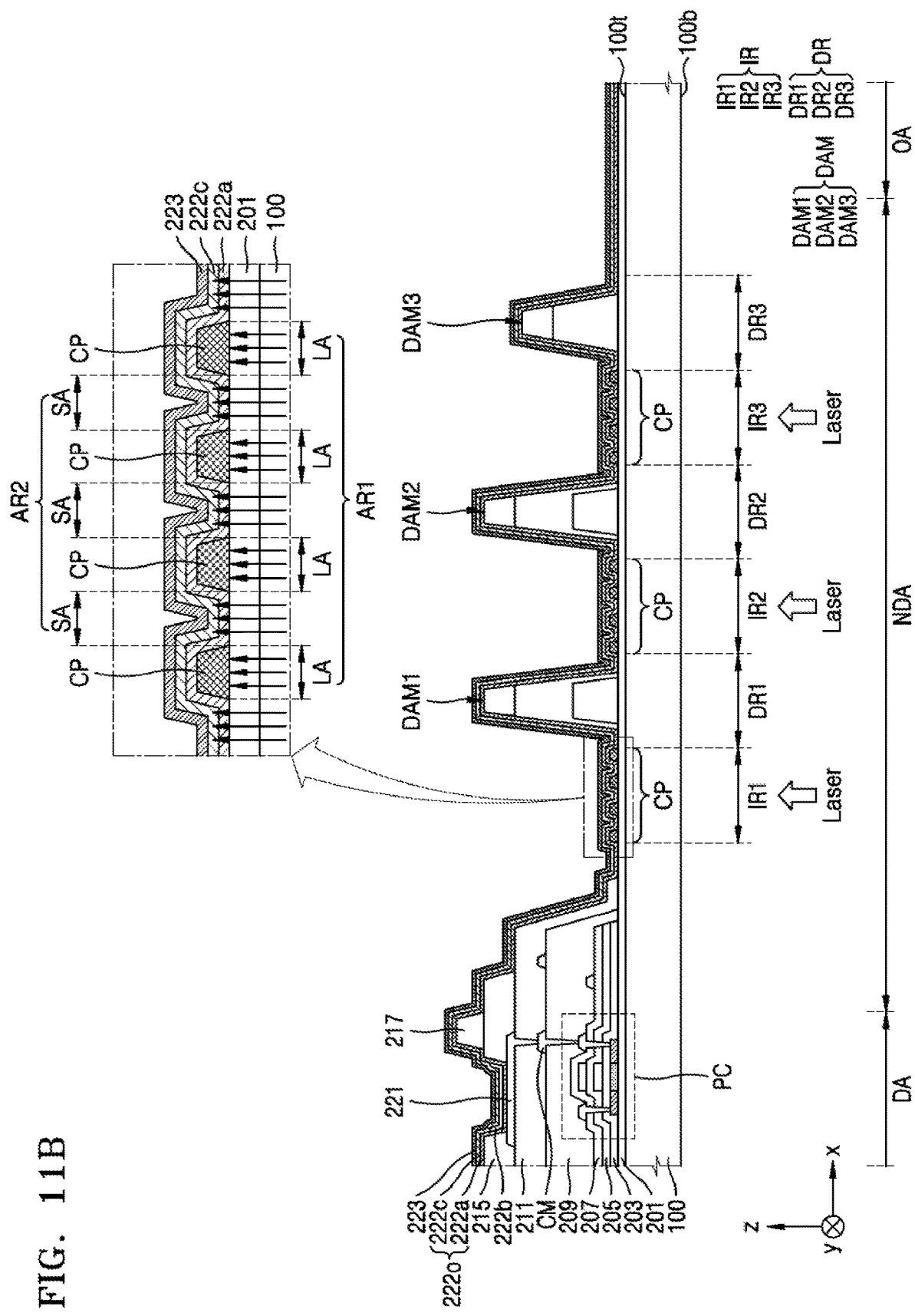

As shown in FIG. 11A to be described below, a conductive pattern CP may be arranged on the first area AR1, and may not be arranged on the second area AR2. A laser beam may be irradiated to or directed to the irradiated region IR, and a laser beam penetrating the insulating layer 201 may reach the conductive pattern CP on the first area AR1. Heat may be transmitted to the first area AR1 of the insulating layer 201 in contact with the conductive pattern CP through the conductive pattern CP heated by the laser beam. In other words, the first area AR1 of the insulating layer 201 may receive radiant heat due to the laser beam and conductive heat due to the conductive pattern CP.

On the other hand, because the conductive pattern CP is not arranged on the second area AR2 of the insulating layer 201, the second area AR2 of the insulating layer 201 does not receive the conductive heat due to the conductive pattern CP. Accordingly, the first area AR1 (e.g., a portion of the insulating layer 201 corresponding to the first area AR1) subjected to heat conduction treatment by the heated conductive pattern CP may have different physical and/or chemical properties from the second area AR2 (e.g., a portion of the insulating layer 201 corresponding to the second area AR2).

In an embodiment, the first area AR1 may include a plurality of line areas LA, and the second area AR2 may include a plurality of space areas SA.

The line areas LA may extend in the first direction DIR1 and may be arranged to be apart from or spaced from each other in the second direction DIR2. The space areas SA may extend in the first direction DIR1 and may be arranged to be apart from or spaced from each other in the second direction DIR2. The line areas LA and the space areas SA may be alternately arranged with each other along the second direction DIR2.

As described above, when the planar shape of the irradiated region IR is circular, planar shapes of the first area AR1 and the second area AR2 forming the irradiated region IR may also be circular. In this case, the first direction DIR1 may be a circumferential direction, and the second direction DIR2 may be a radial direction.

FIG. 5B shows that the first area AR1 and the second area AR2 of the irradiated region IR respectively include the line areas LA and space areas SA extending in the first direction DIR1. However, this is only an embodiment, and shapes of the first area AR1 and the second area AR2 of the irradiated region IR may suitably vary. For example, an extending direction of the first area AR1 may be different from an extending direction of the second area AR2, or the first area AR1 may be around (e.g., surround) the second area AR2. Detailed descriptions thereof will be described below with reference to FIGS. 8-10.

Meanwhile, referring back to FIG. 5A, a plurality of dams DAM may be arranged on the dam regions DR, respectively. For example, as shown in FIG. 5A, a first dam DAM1 may be on the first dam region DR1, a second dam DAM2 may be on the second dam region DR2, and a third dam DAM3 may be on the third dam region DR3. FIG. 5A shows that three dams DAM are on the non-display area NDA, but the number of dams DAM on the non-display area NDA may suitably vary.

Figure 6A:
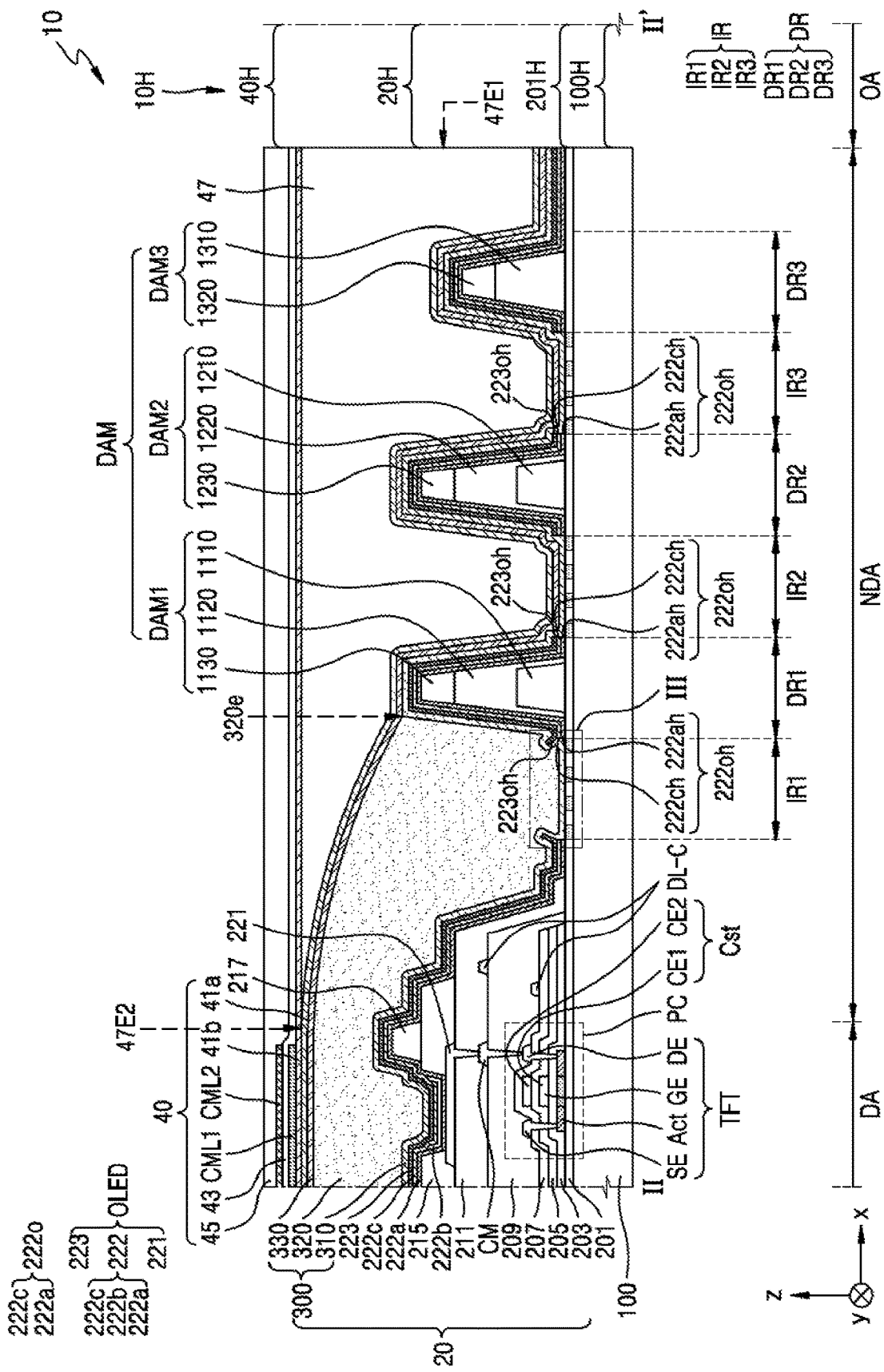
FIG. 6A is a cross-sectional view of a portion of the display apparatus, taken along the line II-II' of FIG. 5A.
Figure 6B:
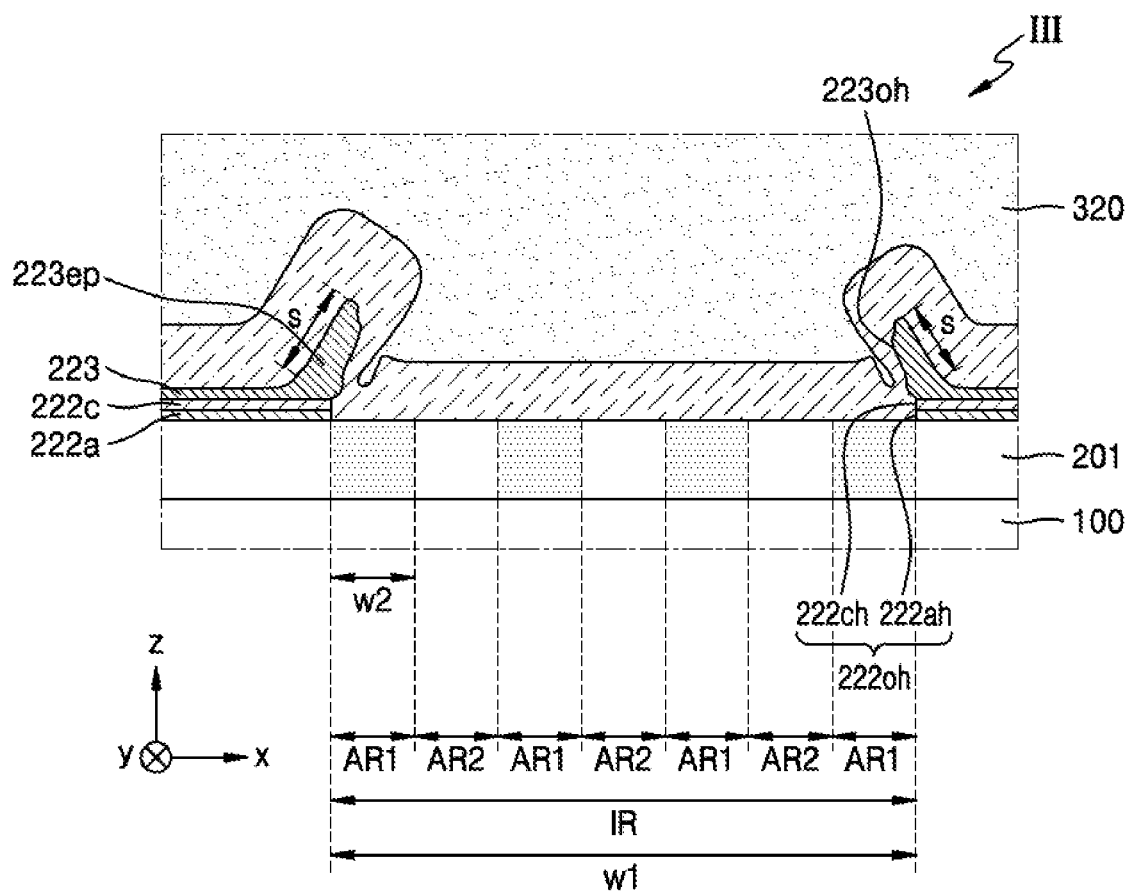
FIG. 6B is an enlarged plan view of a portion of FIG. 6A.

FIG. 6A is a cross-sectional view of a portion of the display apparatus, taken along the line II-II' of FIG. 5A, and FIG. 6B is an enlarged plan view schematically showing a portion of FIG. 6A.

FIG. 6A illustrates the display element layer 20 and the input sensing layer 40 on the display element layer 20 by omitting the optical functional layer 50 (e.g., see FIG. 2) and the cover window 60 (e.g., see FIG. 2) in the display apparatus 10 for convenience of description. The display element layer 20 includes light-emitting diodes arranged on the substrate 100 to correspond to the display area DA, and in this regard, FIG. 6A shows one light-emitting diode, for example, the organic light-emitting diode OLED.

The display apparatus 10 may include the opening 10H in the opening area OA. The opening 10H may have a shape of a through hole penetrating upper and lower surfaces of the display apparatus 10.

That the display apparatus 10 includes the opening 10H in the opening area OA may indicate that a plurality of layers included in the display apparatus 10 also include an opening in the opening area OA. The substrate 100 may include an opening 100H in the opening area OA, and the opening 100H of the substrate 100 has a shape of a through hole penetrating upper and lower surfaces of the substrate 100. Similarly, the insulating layer 201 on the substrate 100 may include the opening 201H in the opening area OA, and the opening 201H of the insulating layer 201 has a shape of a through hole penetrating upper and lower surfaces of the insulating layer 201. The display element layer 20 including layers arranged on the substrate 100 may include the first opening 20H having a through-hole shape located in the opening area OA, and the input sensing layer 40 may include the second opening 40H having a through-hole shape located in the opening area OA. In an embodiment, the opening 10H may include the opening 100H, the opening 201H, the first opening 20H, and/or the second opening 40H.

FIG. 6A shows that the substrate 100, the insulating layer 201, the display element layer 20, and the input sensing layer 40 include openings located in the opening area OA, respectively, but at least one of the substrate 100, the insulating layer 201, the display element layer 20, and the input sensing layer 40 may not include an opening.

In an embodiment, as described above with reference to FIG. 5A, the insulating layer 201 may include the irradiated regions IR and the dam regions DR on the non-display area NDA. Each of the irradiated regions IR is an area to which a laser beam is irradiated when the display apparatus 10 is manufactured, and may include the first area AR1 and the second area AR2. The dams DAM may be arranged on the dam regions DR.

The display apparatus 10 may include an organic material layer 222o and a second electrode 223 (e.g., an electrode layer). The organic material layer 222o may be arranged on the insulating layer 201, and the second electrode 223 may be arranged on the organic material layer 222o. In this case, the organic material layer 222o may have first openings 222oh exposing at least a portion of each of the irradiated regions IR of the insulating layer 201. The second electrode 223 may have second openings 223oh corresponding to the first openings 222oh, respectively. The first openings 222oh and the second openings 223oh may overlap each other (e.g., in a thickness direction of the insulating layer 201).

Hereinafter, the display apparatus 10 according to an embodiment will be described in more detail according to a stacking order shown in FIGS. 6A and 6B.

First, looking at the display area DA of FIG. 6A, the pixel circuit PC may be on the substrate 100, and the organic light-emitting diode OLED may be on and/or connected to the pixel circuit PC.

The substrate 100 may include a glass material or a polymer resin. For example, the polymer resin may include polyethersulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multilayer structure including a layer including the above-described polymer resin and an inorganic layer.

The insulating layer 201 may be on an upper surface of the substrate 100. The insulating layer 201 may include a buffer layer, a barrier layer, or a buffer layer and a barrier layer. The insulating layer 201 may prevent or substantially prevent impurities from penetrating into a semiconductor layer Act of a thin-film transistor TFT. The insulating layer 201 may include an inorganic insulating material such as silicon nitride, silicon oxynitride, and silicon oxide, and may include a single layer or multiple layers including the inorganic insulating material described above.

The pixel circuit PC may be on the insulating layer 201. The pixel circuit PC includes the thin film transistor TFT and the storage capacitor Cst. The thin film transistor TFT may include the semiconductor layer Act, a gate electrode GE, a source electrode SE, and a drain electrode DE. FIG. 6A shows a top gate-type transistor in which the gate electrode GE is above the semiconductor layer Act with a gate-insulating layer 203 therebetween. However, according to another embodiment, the thin-film transistor TFT may also be a bottom gate-type transistor.

The semiconductor layer Act may include polysilicon. Alternatively, the semiconductor layer Act may include amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), or the like, and may be formed as a single layer or multiple layers including the above-described materials.

The gate-insulating layer 203 between the semiconductor layer Act and the gate electrode GE may include an inorganic insulating material such as silicon oxide, silicon nitride, silicon oxynitride, aluminum oxide, titanium oxide, tantalum oxide, hafnium oxide, and the like. The gate-insulating layer 203 may include a single layer or multiple layers including the above-described materials.

The source electrode SE and the drain electrode DE may include a conductive material (e.g., a material having good conductivity). The source electrode SE and the drain electrode DE may include a conductive material including Mo, Al, Cu, Ti, or the like, and may be formed as a single layer or multiple layers including the above-described materials. In an embodiment, the source electrode SE and the drain electrode DE may include multiple layers such as a Ti layer, an Al layer, and a Ti layer (Ti/Al/Ti).

The storage capacitor Cst may include a lower electrode CE1 and an upper electrode CE2 that overlap each other with a first interlayer insulating layer 205 therebetween. The storage capacitor Cst may overlap the thin film transistor TFT. In this regard, FIG. 6A shows that the gate electrode GE of the thin-film transistor TFT is the lower electrode CE1 of the storage capacitor Cst. In another embodiment, the storage capacitor Cst may not overlap the thin film transistor TFT, and the gate electrode GE of the thin film transistor TFT and the lower electrode CE1 of the storage capacitor Cst may be formed separately. The storage capacitor Cst may be covered with a second interlayer insulating layer 207.

The lower electrode CE1 and/or the upper electrode CE2 of the storage capacitor Cst may include a conductive material including Mo, Al, Cu, Ti, or the like and may be formed as a single layer or multiple layers including the above materials.

The first interlayer insulating layer 205 and the second interlayer insulating layer 207 may include an inorganic insulating material such as silicon oxide, silicon nitride, silicon oxynitride, aluminum oxide, titanium oxide, tantalum oxide, hafnium oxide, or the like. The first interlayer insulating layer 205 and the second interlayer insulating layer 207 may include a single layer or multiple layers including the above materials. Alternatively, the first interlayer insulating layer 205 and the second interlayer insulating layer 207 may include an organic insulating material. The organic insulating material may include a general polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof.

The pixel circuit PC including the thin-film transistor TFT and the storage capacitor Cst may be covered by a first intermediate insulating layer 209 (e.g., a first organic insulating layer) between the pixel circuit PC described above and a first electrode 221 (or a pixel electrode) to be described below. The first intermediate insulating layer 209 may include an approximately planar top surface.

The first electrode 221 may be on the pixel circuit PC. The first electrode 221 may be arranged for each pixel, and the first electrode 221 may be connected (e.g., electrically connected) to the pixel circuit PC. For example, as shown in FIG. 6A, a contact metal layer CM may be between the thin film transistor TFT and the first electrode 221. The contact metal layer CM may be connected to the thin film transistor TFT through a contact hole formed in the first intermediate insulating layer 209, and the first electrode 221 may be connected to the contact metal layer CM through a contact hole formed in a second intermediate insulating layer 211 (e.g., a second organic insulating layer) on the contact metal layer CM. The contact metal layer CM may include a conductive material including Mo, Al, Cu, Ti, or the like, and may be formed as a single layer or multiple layers including the above-described materials. In an embodiment, the contact metal layer CM may include multiple layers of Ti/Al/Ti.

The first intermediate insulating layer 209 and the second intermediate insulating layer 211 may include an organic insulation material such as a general commercial polymer such as PMMA or PS, a polymer derivative including a phenolic group, an acrylic polymer, an imide polymer, an aryl ether polymer, an amide polymer, a fluorine-based polymer, a p-xylene-based polymer, a vinyl alcohol polymer, and/or a blend thereof. In an embodiment, the first intermediate insulating layer 209 and the second intermediate insulating layer 211 may include polyimide.

FIG. 6A shows that the contact metal layer CM is between the first intermediate insulating layer 209 and the second intermediate insulating layer 211, and connects (e.g., electrically connects) the pixel circuit PC to the first electrode 221. However, in another embodiment, the contact metal layer CM may be omitted. In this case, the transistor TFT of the pixel circuit PC may be directly connected to the first electrode 221, and one of the first intermediate insulating layer 209 and the second intermediate insulating layer 211 may be omitted. For example, one intermediate insulating layer may be between the pixel circuit PC and the first electrode 221, and the first electrode 221 may be connected to the transistor TFT of the pixel circuit PC through the one intermediate insulating layer.

The first electrode 221 may be formed on the second intermediate insulating layer 211. The first electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the first electrode 221 may further include a film formed of ITO, IZO, ZnO, or $In_2O_3$ above and/or below the above-described reflective layer. In an embodiment, the first electrode 221 may have a three-layer structure of ITO/Ag/ITO.

An upper insulating layer 215 may be formed on the first electrode 221. The upper insulating layer 215 may include an opening exposing an upper surface of the first electrode 221 and may cover an edge of the first electrode 221. The upper insulating layer 215 may be a pixel-defining layer defining pixels. For example, a width of the opening of the upper insulating layer 215 exposing the upper surface of the first electrode 221 may correspond to a width of a light-emitting area from which light is emitted, or a width of a pixel.

The upper insulating layer 215 may include an organic insulating material. For example, the upper insulating layer 215 may include an organic insulation material such as a general commercial polymer such as PMMA or PS, a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof.

A spacer 217 may be formed on the upper insulating layer 215. The spacer 217 may include an organic insulating material. The spacer 217 may include a same material as that of the upper insulating layer 215 and may be formed together (or concurrently) in a same mask process.

An intermediate layer 222 includes a light-emitting layer 222b. The light-emitting layer 222b may include a polymer organic material or a low molecular weight organic material that emits light of a certain color. The intermediate layer 222 may include a functional layer. The functional layer may include a first functional layer 222a arranged below the light-emitting layer 222b and/or a second functional layer 222c arranged above the light-emitting layer 222b.

The first functional layer 222a may include a single layer or multiple layers. For example, the first functional layer 222a may include a hole injection layer (HIL) and/or a hole transport layer (HTL).

The second functional layer 222c may include a single layer or multiple layers. The second functional layer 222c may include an electron transport layer (ETL) and/or an electron injection layer (EIL).

At least one organic material layer 222o (hereinafter referred to as organic material layer) included in the intermediate layer 222, for example, the first functional layer 222a and/or the second functional layer 222c may be formed to cover the display area DA (e.g., cover the display area DA as a whole). In the display area DA, light-emitting layers 222b of different colors may be arranged to be apart from or spaced from each other according to the color of a corresponding pixel. However, the first functional layer 222a and/or the second functional layer 222c may be formed to cover the display area DA as a whole. Each of the first and second functional layers 222a and 222c may be shared by a plurality of pixels arranged in the display area DA. Accordingly, each of the first functional layer 222a and the second functional layer 222c may be formed to cover the plurality of first electrodes 221.

The second electrode 223 may include a conductive material having a low work function. For example, the second electrode 223 may include a (semi) transparent layer including Ag, Mg, Al, Pt, Pd, Au, Ni, Nd, Ir, Cr, lithium (Li), calcium (Ca), or an alloy thereof. Alternatively, the second electrode 223 may further include a layer such as ITO, IZO, ZnO, or $In_2O_3$ on the (semi) transparent layer including the above-mentioned material. In an embodiment, the second electrode 223 may include Ag and/or Mg. The second electrode 223 may be formed to cover the display area DA (e.g., cover the display area DA as a whole). The second electrode 223 may be a common layer and may cover the plurality of first electrodes 221. The second electrode 223 and the functional layer, which may be common layers covering the display area DA (e.g., covering the display area DA as a whole), may have different thicknesses from each other. A thickness of the second electrode 223 may be less than a thickness of the organic material layer 222o (e.g., a stack of the first and second functional layers 222a and 222c) included in the intermediate layer 222.

The organic light-emitting diode OLED including the first electrode 221, the intermediate layer 222, and the second electrode 223 is covered with an encapsulation layer 300. The encapsulation layer 300 may include at least one organic encapsulation layer and at least one inorganic encapsulation layer. FIG. 6A shows that the encapsulation layer 300 includes first and second inorganic encapsulation layers 310 and 330 and an organic encapsulation layer 320 therebetween. In another embodiment, the number of organic encapsulation layers, the number of inorganic encapsulation layers, and a stacking order may be changed in a suitable manner.

The first inorganic encapsulation layer 310 and the second inorganic encapsulation layer 330 may include one or more inorganic materials selected from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or multiple layers including the above materials. The organic encapsulation layer 320 may include a polymer-based material. Examples of the polymer-based material may include an acrylic resin, an epoxy resin, polyimide, or polyethylene such as polymethyl methacrylate and polyacrylic acid. In an embodiment, the organic encapsulation layer 320 may include an acrylate polymer.

Materials of the first inorganic encapsulation layer 310 and the second inorganic encapsulation layer 330 may be different from each other. For example, the first inorganic encapsulation layer 310 may include silicon oxynitride, and the second inorganic encapsulation layer 330 may include silicon nitride. Thicknesses of the first inorganic encapsulation layer 310 and the second inorganic encapsulation layer 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thickness of the first inorganic encapsulation layer 310 may be the same as that of the second inorganic encapsulation layer 330.

The input sensing layer 40 may be on the encapsulation layer 300. The input sensing layer 40 may include first input insulating layers 41a and 41b, a first conductive layer CML1, a second input insulating layer 43, a second conductive layer CML2, and a third input insulating layer 45.

The first input insulating layers 41a and 41b may include the first sub-insulating layer 41a and the second sub-insulating layer 41b. The first sub-insulating layer 41a and the second sub-insulating layer 41b may include an inorganic insulating material such as silicon oxide, silicon nitride, and silicon oxynitride.

The first conductive layer CML1 and the second conductive layer CML2 may include conductive materials, for example, respective metals. For example, the first conductive layer CML1 and the second conductive layer CML2 may include Mo, Al, Cu, Ti, or the like, and may be formed as a single layer or multiple layers including the above materials. In an embodiment, each of the first conductive layer CML1 and the second conductive layer CML2 may have a structure in which a Ti layer, an Al layer, and a Ti layer are sequentially stacked (Ti/Al/Ti). The conductive materials of the first conductive layer CML1 and the second conductive layer CML2 may be the same as or different from each other.

The first conductive layer CML1 and/or the second conductive layer CML2 may include a plurality of touch electrodes for sensing a touch input. In an embodiment, the input sensing layer 40 may include touch electrodes extending in the ±x direction and touch electrodes extending in the ±y direction in a plan view, and the touch electrodes may sense an input in a mutual cap method (mutual capacitance method) and may be provided on the first conductive layer CML1 and/or the second conductive layer CML2. In another embodiment, a touch electrode may sense an input in a self-cap method (self-capacitance method), and may be provided on the first conductive layer CML1 or the second conductive layer CML2.

The second input insulating layer 43 may be between the first conductive layer CML1 and the second conductive layer CML2. The second input insulating layer 43 may include an inorganic insulating material such as silicon oxide, silicon nitride, and silicon oxynitride.

The third input insulating layer 45 may include an organic insulating material. For example, the third input insulating layer 45 may include a polymer-based material. The polymer-based material described above may be transparent. For example, the third input insulating layer 45 may include a silicone resin, an acrylic resin, an epoxy resin, polyimide, polyethylene, or the like.

FIG. 6A shows that the input sensing layer 40 includes the first conductive layer CML1 and the second conductive layer CML2. However, in another embodiment, the input sensing layer 40 may include any one of the first conductive layer CML1 and the second conductive layer CML2.

Next, looking at the non-display area NDA of FIG. 6A, the first intermediate insulating layer 209 and the second intermediate insulating layer 211 may extend to the non-display area NDA. For example, the first intermediate insulating layer 209 and the second intermediate insulating layer 211 may extend to the non-display area NDA, but may be apart from or spaced from the first dam DAM1. Similarly, each of the gate-insulating layer 203, the first interlayer insulating layer 205, and the second interlayer insulating layer 207 may extend to the non-display area NDA, but may be apart from or spaced from the first dam DAM1.

In this case, the first intermediate insulating layer 209 may extend further toward the first dam DAM1 than the gate-insulating layer 203 extends toward the first dam DAM1, the first interlayer insulating layer 205 extends toward the first dam DAM1, and the second interlayer insulating layer 207 extends toward the first dam DAM1, and may cover an edge of each of the gate-insulating layer 203, the first interlayer insulating layer 205, and the second interlayer insulating layer 207. The second intermediate insulating layer 211 may extend further toward the first dam DAM1 than the first intermediate insulating layer 209 extends toward the first dam DAM1 to cover an edge of the first intermediate insulating layer 209.

FIG. 6A shows that each of the gate-insulating layer 203, the first interlayer insulating layer 205, and the second interlayer insulating layer 207 extends to the non-display area NDA, but is apart from or spaced from the first dam DAM1. However, as another example, the insulating layer 201, the gate-insulating layer 203, the first interlayer insulating layer 205, and/or the second interlayer insulating layer 207 may be arranged to cover the non-display area NDA (e.g., cover the non-display area NDA as a whole).

In the non-display area NDA, bypass portions DL-C of data lines may be on the first intermediate insulating layer 209 and the second interlayer insulating layer 207, respectively. The bypass portion DL-C of the data line on the first intermediate insulating layer 209 shown in FIG. 6A and the bypass portion DL-C of the data line on the second interlayer insulating layer 207 correspond to a portion (a portion curved along the opening area OA in FIG. 3) of the data line DL described above with reference to FIG. 3 located in the non-display area NDA.

As described above in FIG. 5A, on the non-display area NDA, the insulating layer 201 may include the irradiated regions IR and the dam regions DR. The irradiated regions IR and the dam regions DR may be alternately arranged with each other.

Each of the irradiated regions IR may include the first area AR1 and the second area AR2. The first area AR1 (e.g., a portion of the insulating layer 201 corresponding to the first area AR1) may have different physical and/or chemical properties from the second area AR2 (e.g., a portion of the insulating layer 201 corresponding to the second area AR2) due to a heat or thermal conduction treatment. For example, the first area AR1 may have a higher film density than the second area AR2, and may effectively block impurities or foreign materials introduced from the outside. Accordingly, the product stability of the display apparatus 10 may increase, and a defect rate may decrease.

At least one dam is in the non-display area NDA. In an embodiment, FIG. 6A shows that there are three dams, but in another embodiment, there may be two or more dams. The first dam DAM1, the second dam DAM2, and the third dam DAM3 may be in (e.g., directly above) the dam region DR of the insulating layer 201. As described above, when the gate-insulating layer 203, the first interlayer insulating layer 205, and/or the second interlayer insulating layer 207 covers (e.g., entirely covers) the non-display area NDA, the first dam DAM1, the second dam DAM2, and the third dam DAM3 may be on the gate-insulating layer 203, the first interlayer insulating layer 205, and/or the second interlayer insulating layer 207.

The first dam DAM1, the second dam DAM2, and the third dam DAM3 are arranged in the non-display area NDA, but may be apart from or spaced from each other in a direction from the display area DA toward the opening area OA. The first dam DAM1 may be closest to the display area DA, the third dam DAM3 may be closest to the opening area OA, and the second dam DAM2 may be between the first dam DAM1 and the third dam DAM3. As shown in FIG. 5A, each of the first dam DAM1, the second dam DAM2, and the third dam DAM3 may have a closed-loop shape around (e.g., surrounding) the opening area OA.

As shown in FIG. 6A, the opening 100H may be formed in the substrate 100 in correspondence with the opening 10H of the display apparatus 10, and the opening 201H may also be formed in the insulating layer 201. Accordingly, in the present specification, "the opening area OA", "the opening 10H of the display apparatus 10", "the opening 100H of the substrate 100", and "the opening 201H of the insulating layer 201" may be used interchangeably. For example, "around (e.g., surrounding) the opening 10H of the display apparatus 10" may denote "around (e.g., surrounding) the opening 201H of the insulating layer 201", "around (e.g., surrounding) the opening 100H of the substrate 100", and/or "around (e.g., surrounding) the opening area OA".

The first dam DAM1, the second dam DAM2, and the third dam DAM3 may include an insulating material. For example, the first dam DAM1, the second dam DAM2, and the third dam DAM3 may include an organic insulating material. The first dam DAM1, the second dam DAM2, and the third dam DAM3 may be formed together (or concurrently) in a process of forming a plurality of insulating material layers arranged in the above-described display area DA, and may include a same material as that of the plurality of insulating material layers described above.

As shown in FIG. 6A, the first dam DAM1 may include a plurality of first sub-dam layers 1110, 1120, and 1130. The first sub-dam layers 1110, 1120, and 1130 may include a first-1 sub-dam layer 1110, a first-2 sub-dam layer 1120, and a first-3 sub-dam layer 1130 that are stacked (e.g., sequentially stacked).

FIG. 6A shows that the first-2 sub-dam layer 1120 covers an upper surface and a sidewall of the first-1 sub-dam layer 1110. However, as another example, the sidewall of the first-1 sub-dam layer 1110 and a sidewall of the first-2 sub-dam layer 1120 may be flush with the sidewall of the first-2 sub-dam layer 1120 and a sidewall of the first-3 sub-dam layer 1130.

In an embodiment, the first-1 sub-dam layer 1110 may include a same material as that of the second intermediate insulating layer 211, the first-2 sub-dam layer 1120 may include a same material as that of the upper insulating layer 215, and the first-3 sub-dam layer 1130 may include a same material as that of the spacer 217. The first-3 sub-dam layer 1130 may include a same material as that of the first-2 sub-dam layer 1120 and may be formed together (or concurrently) in a same mask process.

As shown in FIG. 6A, the second dam DAM2 may include a plurality of second sub-dam layers 1210, 1220, and 1230. The second sub-dam layers 1210, 1220, and 1230 may include a second-1 sub-dam layer 1210, a second-2 sub-dam layer 1220, and a second-3 sub-dam layer 1230 that are stacked (e.g., sequentially stacked).

FIG. 6A shows that the second-2 sub-dam layer 1220 covers an upper surface and a sidewall of the second-1 sub-dam layer 1210. However, as another example, the sidewall of the second-1 sub-dam layer 1210 and a sidewall of the second-2 sub-dam layer 1220 may be flush with the sidewall of the second-2 sub-dam layer 1220 and a sidewall of the second-3 sub-dam layer 1230.

In an embodiment, the second-1 sub-dam layer 1210 may include a same material as that of the second intermediate insulating layer 211, the second-2 sub-dam layer 1220 may include a same material as that of the upper insulating layer 215, and the second-3 sub-dam layer 1230 may include a same material as that of the spacer 217. The second-3 sub-dam layer 1230 may include a same material as that of the second-2 sub-dam layer 1220 and may be formed together (or concurrently) in a same mask process.

As shown in FIG. 6A, the third dam DAM3 may include a plurality of third sub-dam layers 1310 and 1320. The third sub-dam layers 1310 and 1320 may include a third-1 sub-dam layer 1310 and a third-2 sub-dam layer 1320 that are stacked (e.g., sequentially stacked).

In an embodiment, the third-1 sub-dam layer 1310 may include a same material as that of the upper insulating layer 215, and the third-2 sub-dam layer 1320 may include a same material as that of the spacer 217. The third-2 sub-dam layer 1320 may include a same material as that of the third-1 sub-dam layer 1310 and may be formed together (or concurrently) in a same mask process.

The sub-dam layers of each of the first dam DAM1, the second dam DAM2, and the third dam DAM3 may be formed together (or concurrently) in a same mask process as that of at least one of the first intermediate insulating layer 209, the second intermediate insulating layer 211, the upper insulating layer 215, and the spacer 217, but are not limited thereto and may have various suitable configurations.

A height of at least one of the first dam DAM1, the second dam DAM2, and the third dam DAM3 may be different from each other. For example, as shown in FIG. 6A, the heights of the first and second dams DAM1 and DAM2 may be greater than the height of the third dam DAM3. In other words, a vertical distance from the upper surface of the substrate 100 to upper surfaces of each of the first and second dams DAM1 and DAM2 may be greater than a vertical distance from the upper surface of the substrate 100 to an upper surface of the third dam DAM3.

FIG. 6A shows that the first dam DAM1 and second dam DAM2 have substantially the same height, but in another embodiment, the first dam DAM1 and the second dam DAM2 may have different heights from each other.

One or more dams described above, such as the first dam DAM1, the second dam DAM2, and the third dam DAM3, may control a flow of materials constituting the organic encapsulation layer 320 in a process of forming the encapsulation layer 300. For example, the organic encapsulation layer 320 may be formed by applying a monomer on the display area DA through a process such as inkjet and then curing the monomer. A dam may control a location of the organic encapsulation layer 320 by controlling a flow of the monomer. In this regard, FIG. 6A shows that an edge 320e of the organic encapsulation layer 320 is located on or at one side of the first dam DAM1.

In another embodiment, because the edge 320e of the organic encapsulation layer 320 is located on or at an upper surface of the first dam DAM1, a portion of the organic encapsulation layer 320 may overlap the upper surface of the first dam DAM1. In another embodiment, the edge 320e of the organic encapsulation layer 320 may be on or at one side of the second dam DAM2, and in this case, a portion of the organic encapsulation layer 320 may overlap the upper surface of the first dam DAM1. A location of the organic encapsulation layer 320 may be confirmed using an image of the display apparatus 10 including the organic encapsulation layer 320. The display apparatus 10 according to an embodiment may be used to monitor the location of the organic encapsulation layer 320, for example, a location of the edge 320e of the organic encapsulation layer 320 by having a plurality of dams as described above.

Because the edge 320e of the organic encapsulation layer 320 is located on or at one side of any one dam, for example, the first dam DAM1, the second inorganic encapsulation layer 330 may contact (e.g., directly contact) the first inorganic encapsulation layer 310 in the non-display area NDA. For example, the first and second inorganic encapsulation layers 310 and 330 may contact (e.g., directly contact) each other in an area between the edge 320e of the organic encapsulation layer 320 and the opening 10H of the display apparatus 10. In an embodiment, FIG. 6A shows that the first inorganic encapsulation layer 310 contacts (e.g., directly contacts) the second inorganic encapsulation layer 330 in an area between the first dam DAM1 and the opening 10H of the display apparatus 10.

An insulating layer of the input sensing layer 40, for example, the first input insulating layers 41a and 41b, the second input insulating layer 43, and the third input insulating layer 45 may also extend to cover the non-display area NDA.

A planarization-insulating layer 47 may be arranged to cover the non-display area NDA. The planarization-insulating layer 47 may be located only in the non-display area NDA to have a width ranging from a first edge 47E1 to a second edge 47E2.

Accordingly, in a plan view, the planarization-insulating layer 47 may have a closed curve shape (e.g., a donut shape) around (e.g., surrounding) the opening 10H.

The first edge 47E1 of the planarization-insulating layer 47 may face or define the opening 10H of the display apparatus 10, and the second edge 47E2 of the planarization-insulating layer 47 may be adjacent to the display area DA. A portion of the planarization-insulating layer 47 adjacent to the display area DA may overlap a portion of the organic encapsulation layer 320 while covering the edge 320e of the organic encapsulation layer 320, and the second inorganic encapsulation layer 330 and the first sub-insulating layer 41a may be therebetween.

The first sub-insulating layer 41a may contact (e.g., directly contact) the second sub-insulating layer 41b in the display area DA. In the non-display area NDA, the first sub-insulating layer 41a and the second sub-insulating layer 41b may be apart from or spaced from each other in a thickness direction (e.g., a z direction) by the planarization-insulating layer 47 therebetween.

At least one organic material layer 222o included in the intermediate layer 222, for example, the first functional layer 222a and/or the second functional layer 222c may be disconnected from or at the non-display area NDA. In other words, a portion of the organic material layer 222o may be removed from or at the non-display area NDA.

For example, the organic material layer 222o may have a first opening 222oh located in the non-display area NDA. The first opening 222oh may overlap the irradiated region IR of the insulating layer 201. In this regard, FIG. 6A shows the plurality of first openings 222oh in the non-display area NDA. The first openings 222oh may partially expose the irradiated regions IR of the insulating layer 201, respectively.

The organic material layer 222*o* may include the first functional layer 222*a* and the second functional layer 222*c*, and an opening 222*ah* of the first functional layer 222*a* and an opening 222*ch* of the second functional layer 222*c* may overlap each other to form the first opening 222*oh*. The opening 222*ah* of the first functional layer 222*a* and the opening 222*ch* of the second functional layer 222*c* may be formed while a portion of the first functional layer 222*a* and a portion of the second functional layer 222*c* are removed, respectively, and the first functional layer 222*a* and the second functional layer 222*c* may be discontinuous in the non-display area NDA by or at the openings 222*ah* and 222*ch*, respectively.

At least a portion of the insulating layer 201 under the first opening 222*oh* may be exposed through the first opening 222*oh*, and the first inorganic encapsulation layer 310 may contact (e.g., directly contact) the insulating layer 201 through or in the first opening 222*oh*. For example, the irradiated region IR of the insulating layer 201 under the first opening 222*oh* may be exposed through the first opening 222*oh*, and the first inorganic encapsulation layer 310 may contact (e.g., directly contact) the irradiated region IR of the insulating layer 201 through or in the first opening 222*oh*. The insulating layer 201 may include an inorganic insulating material, and contact between the first inorganic encapsulation layer 310 and the insulating layer 201 may block (e.g., locally block) a progress of moisture.

Because at least one organic material layer 222*o* included in the intermediate layer 222 is formed to cover the display area DA (e.g., cover the display area DA as a whole), the organic material layer 222*o* may provide a path for moisture to flow through the opening 10H of the display apparatus 10. However, according to an embodiment, because the organic material layer 222*o* includes the first opening 222*oh* located in the non-display area NDA, the progress of moisture through the organic material layer 222*o* may be prevented, reduced, or minimized.

The first openings 222*oh* of the organic material layer 222*o* may be arranged to be apart from or spaced from each other in correspondence with the irradiated regions IR of the insulating layer 201. For example, FIG. 6A shows the first opening 222*oh* between the first dam DAM1 and the display area DA, the first opening 222*oh* between the first dam DAM1 and the second dam DAM2, and the first openings 222*oh* between the second dam DAM2 and the third dam DAM3.

FIG. 6A shows that the organic material layer 222*o* include the plurality of first openings 222*oh* so that portions of the organic material layer 222*o* are around (e.g., surround) the first to third dams (the first DAM1, the second DAM2, and the third DAM3), respectively. However, as another example, the organic material layer 222*o* may include one first opening 222*oh*. The organic material layer 222*o* may include a single first opening 222*oh*. In this case, the portions of the organic material layers 222*o* respectively around (e.g., surrounding) the first to third dams DAM1, DAM2, and DAM3 may be omitted.

The first opening 222*oh* may be around (e.g., surround) the opening 10H in a plan view. For example, the first opening 222*oh* may extend along the edge of the opening 10H, and may have a closed loop shape surrounding (e.g., completely surrounding) the opening 10H in a plan view.

The second electrode 223 on the organic material layer 222*o* may be disconnected from or at the non-display area NDA. In other words, a portion of the second electrode 223 may be removed from or at the non-display area NDA.

For example, the second electrode 223 may have a second opening 223*oh* located in the non-display area NDA. The second opening 223*oh* may overlap the first opening 222*oh* and the irradiated region IR of the insulating layer 201. In this regard, FIG. 6A shows the plurality of second openings 223*oh* in the non-display area NDA. The second openings 223*oh* may overlap the first openings 222*oh*, respectively. The second openings 223*oh* may partially expose the irradiated regions IR of the insulating layer 201, respectively.

At least a portion of the insulating layer 201 under the second openings 223*oh* may be exposed through the second opening 223*oh*, and the first inorganic encapsulation layer 310 may contact (e.g., directly contact) the insulating layer 201 through the second opening 223*oh*. For example, the irradiated region IR of the insulating layer 201 under the second opening 223*oh* may be exposed through the second opening 223*oh*, and the first inorganic encapsulation layer 310 may contact (e.g., directly contact) the irradiated region IR of the insulating layer 201 through the second opening 223*oh*. The insulating layer 201 may include an inorganic insulating material, and contact between the first inorganic encapsulation layer 310 and the insulating layer 201 may block (e.g., locally block) a progress of moisture.

The second openings 223*oh* of the second electrode 223 may be arranged to be apart from or spaced from each other in correspondence with the irradiated regions IR of the insulating layer 201. For example, FIG. 6A shows the second opening 223*oh* between the first dam DAM1 and the display area DA, the second opening 223*oh* between the first dam DAM1 and the second dam DAM2, and the second opening 223*oh* between the second dam DAM2 and the third dam DAM3.

FIG. 6A shows that the second electrode 223 includes the plurality of second openings 223*oh* so that portions of the second electrode 223 are around (e.g., surround) the first to third dams DAM1, DAM2, and DAM3, respectively. However, as another example, the second electrode 223 may include one (or a single) second opening 223*oh*. In this case, the portions of the second electrode 223 respectively around (e.g., surrounding) the first to third dams DAM1, DAM2, and DAM3 may be omitted.

The second opening 223*oh* may be around (e.g., surround) the opening 10H in a plan view. For example, the second opening 223*oh* may extend along the edge of the opening 10H, and may have a closed loop shape surrounding (e.g., completely surrounding) the opening 10H in a plan view.

After the second electrode 223 is formed to cover the display area DA and the non-display area NDA (e.g., the entire display area DA and the non-display area NDA), a portion of the second electrode 223 located in the non-display area NDA may be removed. The portion of the second electrode 223 may be removed through a laser lift-off process, and an edge portion 223*ep* of the second electrode 223 may have an irregular shape due to a laser beam. For example, as shown in FIG. 6B, the edge portion 223*ep* of the second electrode 223 may include a burr formed by the laser lift-off process. The edge portion 223*ep* of the second electrode 223 may extend in an oblique direction away from the upper surface of the substrate 100, and a cross-section of the edge portion 223*ep* may have irregularities. Because the edge portion 223*ep* of the second electrode 223 may have an irregular shape by a laser beam, the second opening 223*oh* and the irradiated region IR may not be aligned.

The first inorganic encapsulation layer 310 has relatively excellent step coverage, but the edge portion 223*ep* of the second electrode 223 under the first inorganic encapsulation layer 310 has an irregular shape, so that the first inorganic encapsulation layer 310 may include a portion having a small density and/or a portion having a reduced thickness locally. In this case, cracks may occur in the first inorganic encapsulation layer 310, and the cracks may be transmitted to the surroundings.

However, as shown in FIG. 11B to be described below, during a laser lift-off process, the conductive pattern CP exposing a portion of the irradiated region IR of the insulating layer 201 may be used. As the conductive pattern CP exposes a portion of the irradiated region IR of the insulating layer 201, a portion of the second electrode 223 arranged on the insulating layer 201 may be irradiated (e.g., directly irradiated) with a laser beam. That is, a portion of the second electrode 223 arranged on the irradiated region IR may be heated by a laser beam and vaporized, and another portion of the second electrode 223 may be removed together (or concurrently) with the conductive pattern CP.

In this way, because a portion of the second electrode 223 is vaporized in the irradiated region IR, a size (or a length) s of the edge portion 223ep of the remaining second electrode 223 may be less than a width w1 of the irradiated region IR. Alternatively, the size (or length) s of the edge portion 223ep of the second electrode 223 may be equal to or less than a width w2 of the first area AR1. For example, the size (or length) s of the edge portion 223ep of the second electrode 223 may be about 5 µm or less.

When the conductive pattern CP exposes a portion of the irradiated region IR of the insulating layer 201, the size (or length) s of the edge portion 223ep of the second electrode 223 may be reduced compared to when the conductive pattern CP covers the irradiated region IR. Accordingly, the occurrence of cracks in the first inorganic encapsulation layer 310 due to the edge portion 223ep of the second electrode 223 may be prevented or reduced. In addition, the conductive pattern CP removed by a laser beam may remain as particles, and because a size (or an area) of the conductive pattern CP decreases, a size of the particles may also decrease. Accordingly, the product stability of the display apparatus 10 may increase, and a defect rate may decrease.

Figure 7:
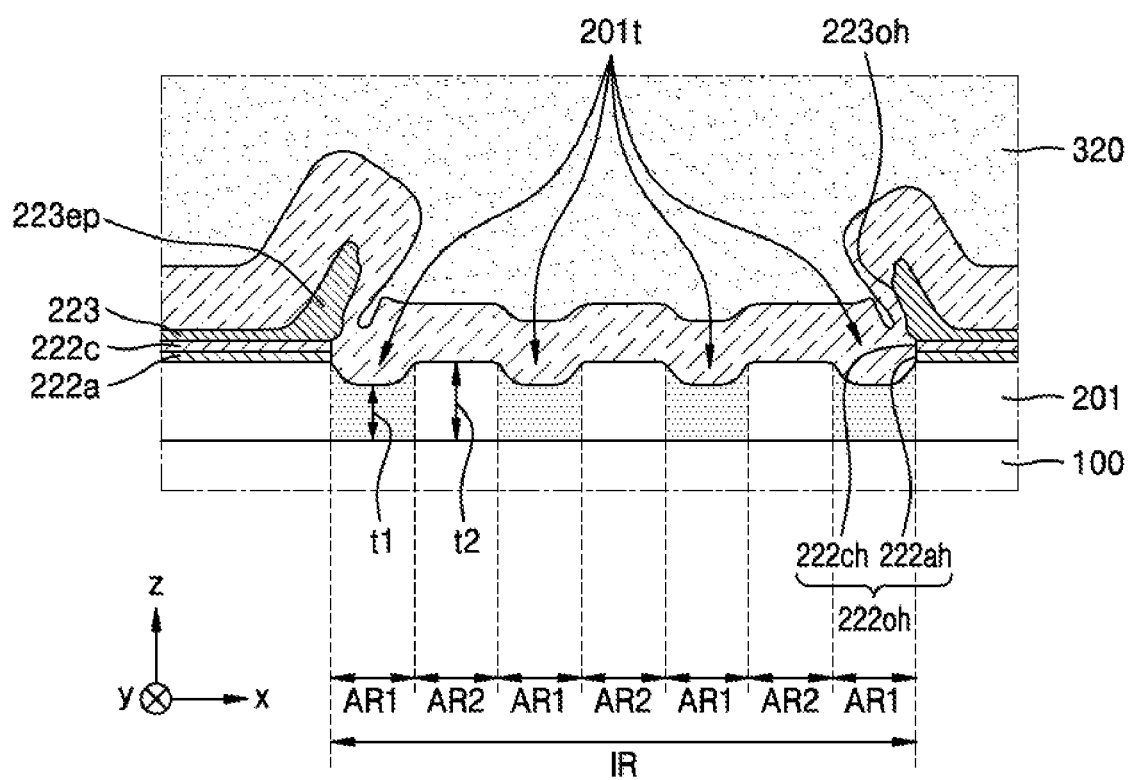
FIG. 7 is an enlarged cross-sectional view of a display apparatus according to another embodiment.

FIG. 7 is an enlarged cross-sectional view of a display apparatus according to another embodiment. FIG. 7 is a modified embodiment of FIGS. 6A and 6B, which differs from FIGS. 6A and 6B in a structure of an insulating layer. Hereinafter, redundant content based on the description of FIGS. 6A and 6B may not be repeated, and differences from the description of FIGS. 6A and 6B may be primarily described.

Referring to FIG. 7, the insulating layer 201 on the substrate 100 may include the irradiated region IR. The irradiated region IR may include the first area AR1 and the second area AR2.

In an embodiment, the insulating layer 201 may have a trench 201t corresponding to the first area AR1. As the insulating layer 201 has the trench 201t, a thickness t1 of a portion of the first area AR1 may be less than a thickness t2 of the second area AR2.

As described above in FIG. 5B, when the first area AR1 includes the plurality of line areas LA, the insulating layer 201 may have a plurality of trenches 201t respectively corresponding to the line areas LA.

When the insulating layer 201 has the trench 201t as in an embodiment, a surface area of the insulating layer 201 may increase. As a result, a penetration path of moisture or oxygen introduced from the outside may increase, and the organic light-emitting diode OLED may be protected from moisture or oxygen.

Figure 8:
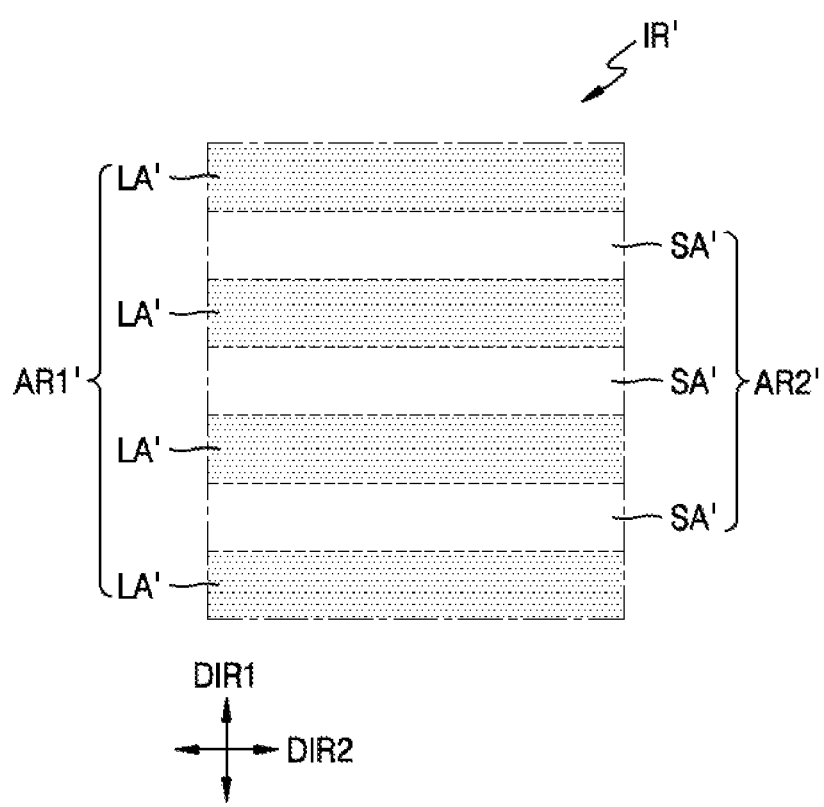
FIG. 8 is an enlarged plan view of a display apparatus according to another embodiment.

FIG. 8 is an enlarged plan view of a display apparatus according to another embodiment. In more detail, FIG. 8 is an enlarged view of a portion of an irradiated region of a non-display area, and shows another embodiment of the irradiated region.

Referring to FIG. 8, an irradiated region IR' may include a first area AR1' and a second area AR2'. In this case, the first area AR1' may be a heat conduction-treated area. The first area AR1' (e.g., a portion of the insulating layer 201 corresponding to the first area AR1') may have different physical and/or chemical properties from the second area AR2' (e.g., a portion of the insulating layer 201 corresponding to the second area AR2') due to a heat or thermal conduction treatment.

In an embodiment, the first area AR1' may include a plurality of line areas LA', and the second area AR2' may include a plurality of space areas SA'.

The line areas LA' may extend in the second direction DIR2 and may be arranged to be apart from or spaced from each other in the first direction DIR1. The space areas SA' may extend in the second direction DIR2 and may be arranged to be apart from or spaced from each other in the first direction DIR1. The line areas LA' and the space areas SA' may be alternately arranged with each other along the first direction DIR1.

As described above in FIG. 5A, when a planar shape of the irradiated region IR' is circular (e.g., a donut shape), planar shapes of the first area AR1' and the second area AR2' forming the irradiated region IR' may also be circular. In this case, the first direction DIR1 may be a circumferential direction, and the second direction DIR2 may be a radial direction.

FIG. 8 shows that the line areas LA' and the space areas SA' extend in the second direction DIR2 but the line areas LA' and the space areas SA' may extend in a third direction crossing the first direction DIR1 and the second direction DIR2.

Figure 9:
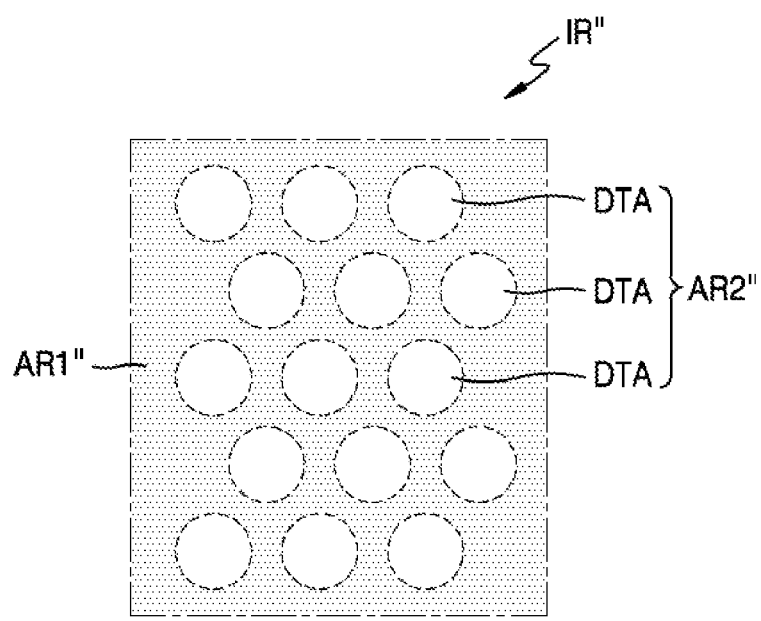
FIG. 9 is an enlarged plan view of a display apparatus according to another embodiment.
Figure 10:
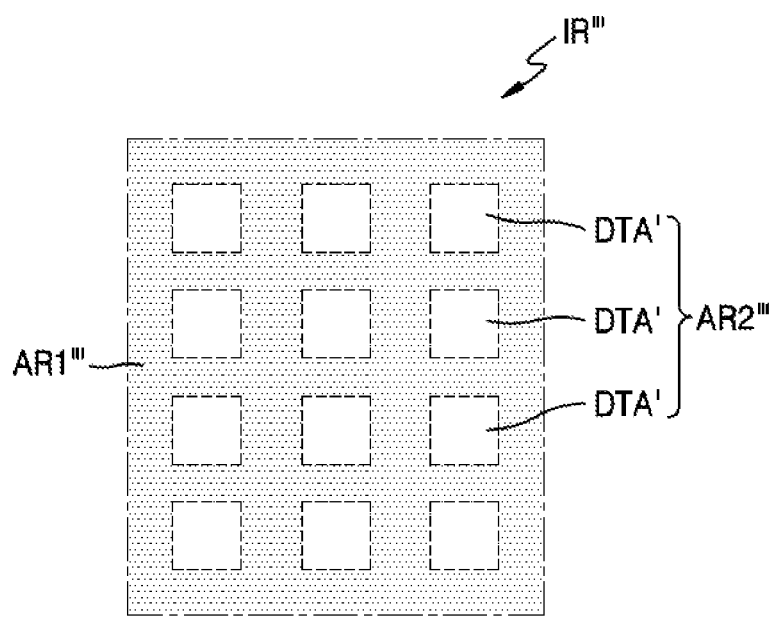
FIG. 10 is an enlarged plan view of a display apparatus according to another embodiment.

FIGS. 9 and 10 are enlarged plan views of a display apparatus according to another embodiment. In more detail, each of FIGS. 9 and 10 is an enlarged view of a portion of an irradiated region in a non-display area, and shows another embodiment of the irradiated region.

Referring to FIGS. 9 and 10, irradiated region IR" may include a first area AR1" and second areas AR2", and irradiated region IR'" may include a first area AR1'" and second areas AR2'". In this case, the first areas AR1" and AR1'" may be heat conduction-treated areas. The first areas AR1" and AR1'" (e.g., portions of the insulating layer 201 corresponding to the first areas AR1" and AR1'") may have different physical and/or chemical properties from the second areas AR2" and AR2'" (e.g., portions of the insulating layer 201 corresponding to the second areas AR2" and AR2'") due to a heat or thermal conduction treatment.

In an embodiment, the second areas AR2" may include a plurality of dot areas DTA surrounded by the first area AR1", and the second areas AR2'" may include a plurality of dot areas DTA' surrounded by the first area AR1'". A number of dot areas DTA and DTA' and a shape thereof may suitably vary. For example, as shown in FIG. 9, a planar shape of the dot areas DTA may be circular, or as shown in FIG. 10, a planar shape of the dot areas DTA' may be rectangular. However, the present disclosure is not limited thereto.

In addition, as shown in FIG. 9, the dot areas DTA may be arranged to be shifted from each other. In another example, as shown in FIG. 10, the dot areas DTA' may be arranged to be apart from or spaced from each other at regular intervals.

Although only a display apparatus has been described so far, the present disclosure is not limited thereto. For example, a method of manufacturing the display apparatus is also within the scopes of the present disclosure.

Figure 11C:
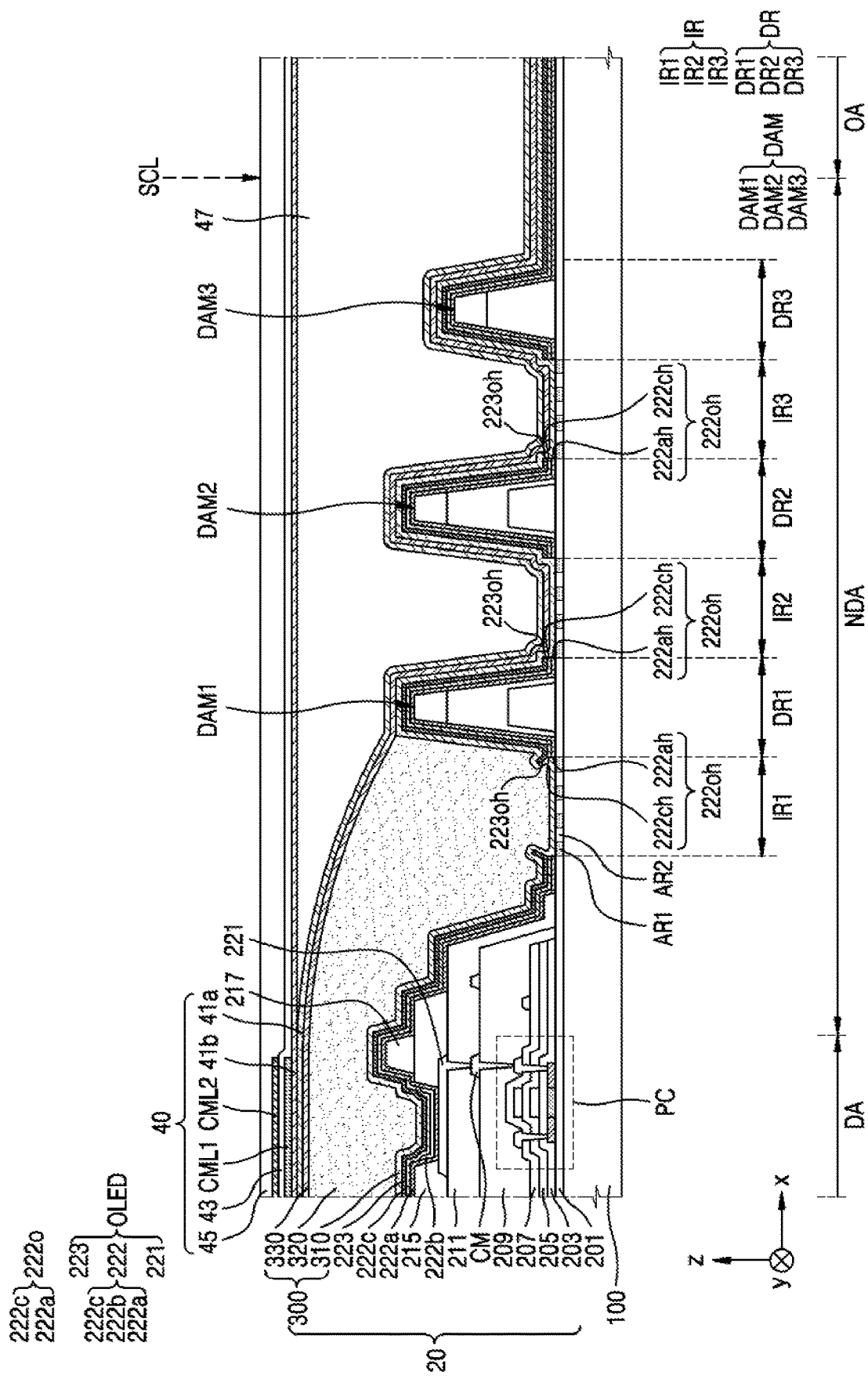
Figure 11D:
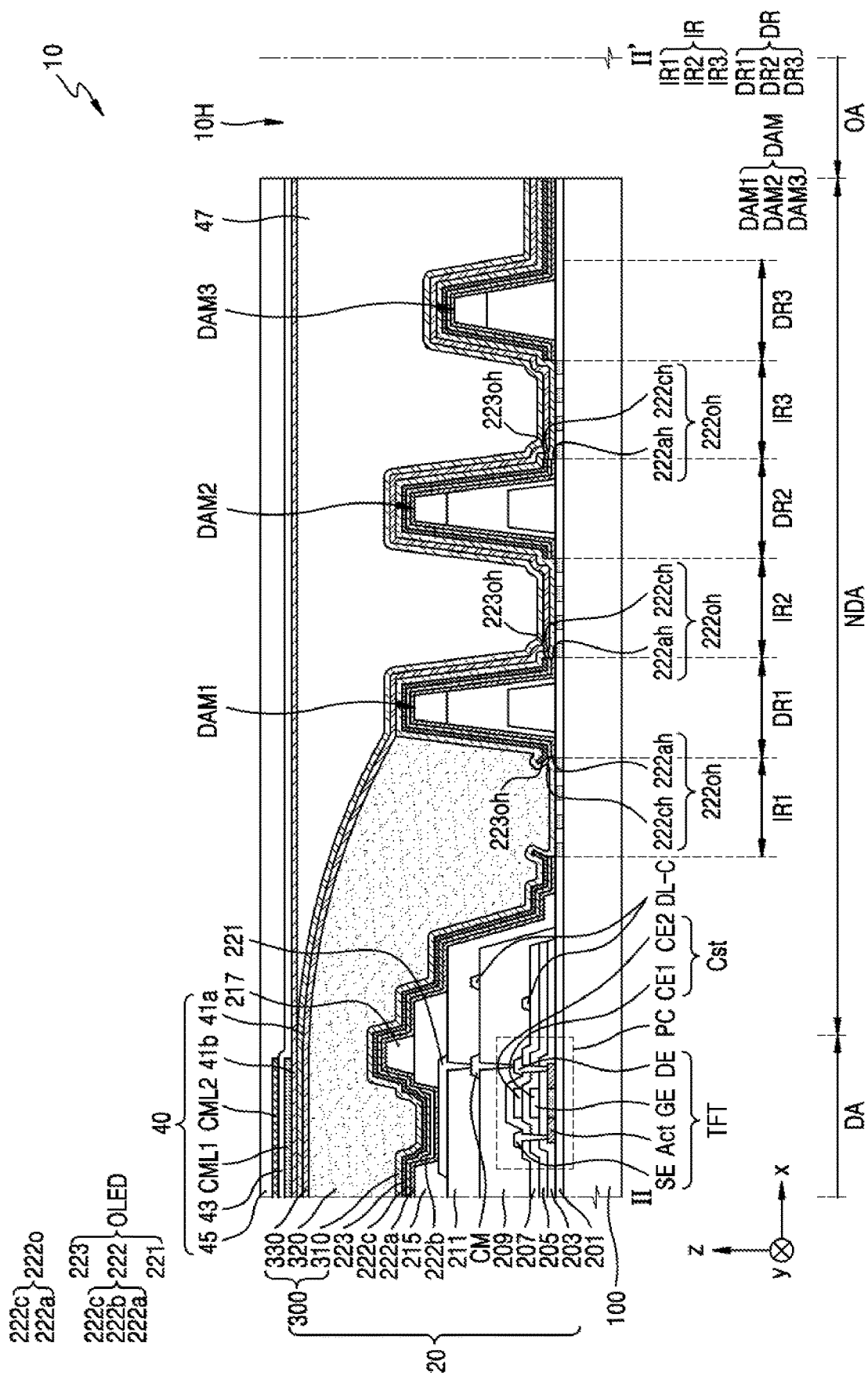
Figure 12:
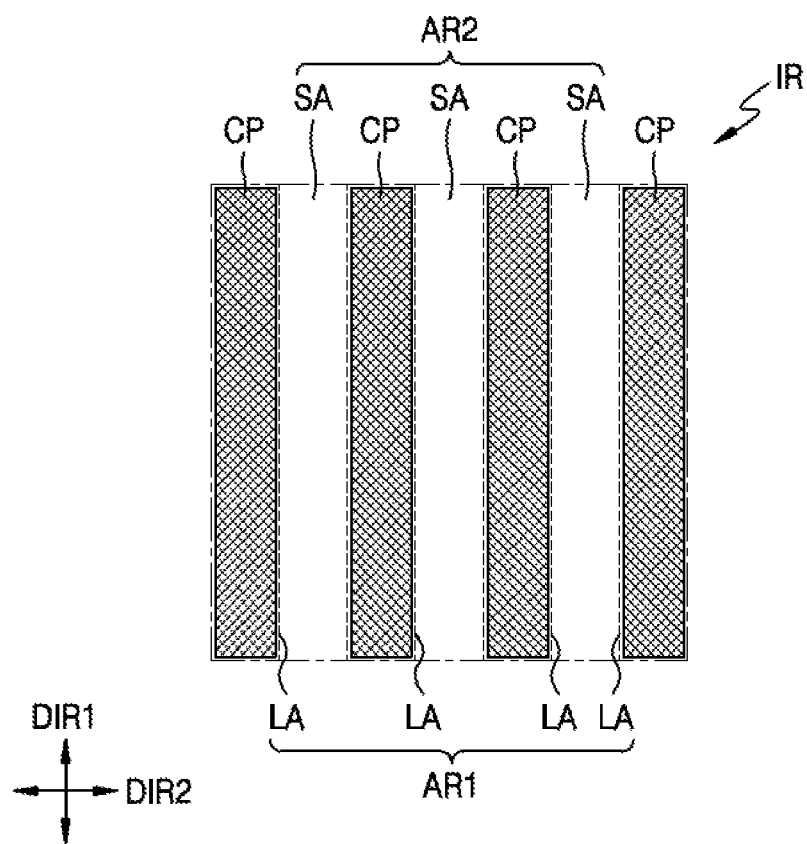
FIG. 12 is an enlarged plan view of a conductive pattern according to an embodiment.

FIGS. 11A-11D are cross-sectional views sequentially illustrating a method of manufacturing a display apparatus according to an embodiment, and FIG. 12 is an enlarged plan view schematically showing a conductive pattern according to an embodiment.

First, referring to FIG. 11A, the pixel circuit PC, the first electrode 221 on the pixel circuit PC, and at least one dam DAM are formed on the substrate 100. Before forming the pixel circuit PC, the insulating layer 201 may be formed to cover the upper surface (e.g., the entire upper surface) of the substrate 100. Thereafter, a semiconductor layer of a thin film transistor, the gate-insulating layer 203, a gate electrode of the thin film transistor and a lower electrode of a storage capacitor, the first interlayer insulating layer 205, an upper electrode of the storage capacitor, the second interlayer insulating layer 207, a source electrode and a drain electrode, the first intermediate insulating layer 209, a contact metal layer, and the second intermediate insulating layer 211 may be formed (e.g., sequentially formed).

While the insulating layer 201 covers the substrate 100 (e.g., cover the substrate 100 as a whole), a portion of at least one layer on the insulating layer 201 may be removed. For example, each of the gate-insulating layer 203, the first interlayer insulating layer 205, the second interlayer insulating layer 207, the first intermediate insulating layer 209, and the second intermediate insulating layer 211, which are formed in the opening area OA and a partial area of the non-display area NDA adjacent to the opening area OA, may be removed. Accordingly, as shown in FIG. 11A, edges 203e, 205e, and 207e of the gate-insulating layer 203, the first interlayer insulating layer 205, and the second interlayer insulating layer 207 facing and/or adjacent to the opening area OA may be apart from or spaced from the first dam DAM1 and be covered with the first intermediate insulating layer 209. Similarly, edges 209e and 211e of the first intermediate insulating layer 209 and the second intermediate insulating layer 211 facing and/or adjacent to the opening area OA may be apart from or spaced from the first dam DAM1. The edge 209e of the first intermediate insulating layer 209 may be covered with the second intermediate insulating layer 211.

FIG. 11A shows that a portion of each of the gate-insulating layer 203, the first interlayer insulating layer 205, and the second interlayer insulating layer 207 is removed on the non-display area NDA. However, as another example, like the insulating layer 201, the gate-insulating layer 203, the first interlayer insulating layer 205, or the second interlayer insulating layer 207 may cover the non-display area NDA as a whole.

The first electrode 221 may be formed on the second intermediate insulating layer 211, and the upper insulating layer 215 and the spacer 217 may be formed on the first electrode 221. When the first electrode 221 is formed in the display area DA, a plurality of conductive patterns CP may be formed in the non-display area NDA, and when insulating material layers including an organic insulating material are formed in the display area DA, at least one dam DAM may be formed in the non-display area NDA.

In this case, the conductive pattern CP may be formed on the irradiated region IR of the insulating layer 201, and the dam DAM may be formed on the dam region DR of the insulating layer 201. As described above with reference to FIG. 5A, the irradiated regions IR of the insulating layer 201 and the dam regions DR of the insulating layer 201 may be alternately arranged with each other. In this case, the conductive patterns CP and the dams DAM may be alternately arranged with each other.

In an embodiment, as described above in FIG. 5B, the irradiated region IR may include the first area AR1 and the second area AR2, and the conductive pattern CP may be formed on the first area AR1 in the irradiated region IR. That is, the conductive pattern CP may cover the first area AR1 of the insulating layer 201 and expose the second area AR2 of the insulating layer 201. The conductive pattern CP may expose a portion of the irradiated region IR.

For example, referring to FIG. 12, the first area AR1 may include a plurality of line areas LA, and the second area AR2 may include a plurality of space areas SA. Because the conductive patterns CP are formed on the first area AR1 in the irradiated region IR, as shown in the enlarged view of FIG. 11A and FIG. 12, the conductive patterns CP may be formed on the line areas LA, respectively. The conductive patterns CP may cover the line areas LA, respectively, and may expose the space areas SA, respectively.

The conductive patterns CP may extend in the first direction DIR1 along shapes of the line areas LA, respectively, and may be apart from or spaced from each other in the second direction DIR2. For example, one conductive pattern CP may be between the display area DA and the first dam DAM1, one conductive pattern CP may be between the first dam DAM1 and the second dam DAM2 adjacent to each other, and one conductive pattern CP may be between second dams DAM2 and the third dams DAM3 adjacent to each other.

As described above in FIG. 5A, when the planar shape of the irradiated region IR is circular (e.g., a donut shape), planar shapes of the first area AR1 and the second area AR2 forming the irradiated region IR may also be circular. A planar shape of the conductive pattern CP following the shape of the first area AR1 may also be circular. In this case, the first direction DIR1 may be a circumferential direction, and the second direction DIR2 may be a radial direction.

FIG. 12 shows that the first area AR1 is around (e.g., surrounds) an outer periphery of the conductive pattern CP, but the first area AR1 and the conductive pattern CP may be aligned.

In addition, FIG. 12 shows that the first area AR1 and the second area AR2 of the irradiated region IR respectively include the line areas LA and the space areas SA extending in the first direction DIR1. However, this is only an embodiment, and shapes of the first area AR1 and the second area AR2 of the irradiated region IR may suitably vary as described above with reference to FIGS. 8-10. Accordingly, the shape of the conductive pattern CP may also be variously modified according to the shape of the first area AR1. Detailed descriptions thereof will be described below with reference to FIGS. 13-15.

The conductive patterns CP may include a same material (e.g., a conductive material) as that of the first electrode 221 and may be formed together (or concurrently) in a same process. For example, the conductive pattern CP may include a metal and a transparent conductive oxide such as ITO/Ag/ITO.

At least one dam DAM, for example, the first to third dams DAM1, DAM2, and DAM3 may have a cross-sectional shape in which a width of a lower portion is greater than a width of an upper portion. The first to third dams DAM1, DAM2, and DAM3 may include a plurality of sub-layers, and each of the sub-layers may be formed together (or concurrently) in a process of forming the first intermediate insulating layer 209, the second intermediate insulating layer 211, the upper insulating layer 215, and/or the spacer 217. Specific materials of the sub-layers of the first to third dams DAM1, DAM2, and DAM3 are as described above with reference to FIG. 6A.

Thereafter, as shown in FIG. 11B, the first functional layer 222a, the light-emitting layer 222b, the second functional layer 222c, and the second electrode 223 may be formed on the first electrode 221. The light-emitting layer 222b may be formed to correspond to the first electrode 221 arranged to be apart from or spaced from each other in the display area DA, whereas the organic material layer 222o as a common layer (e.g., a first functional layer and/or a second functional layer) and the second electrode 223 may be formed to cover the substrate 100 (e.g., the entire substrate 100) as shown in FIG. 11B.

When the organic material layer 222o as a common layer and the second electrode 223 as an electrode layer cover the upper surface (e.g., the entire upper surface) of the substrate 100, there is a problem that a crack occurs or moisture flows into a light-emitting diode. Accordingly, a portion of the organic material layer 222o and a portion of the second electrode 223 may be removed from the non-display area NDA. To this end, the substrate 100 is irradiated with a laser beam. The laser beam may be irradiated in a direction from a rear surface 100b of the substrate 100 toward an upper surface 100t. An output of the laser beam may be set based on a band gap of the second electrode 223. The laser beam may be irradiated once or multiple times (e.g., the substrate 100 may be irradiated once or multiple times by the laser beam), and when the laser beam is irradiated multiple times, a type, an output, and/or an irradiation range (or a size) of the laser beam may change in a suitable manner. A portion of the organic material layer 222o and a portion of the second electrode 223 may be removed by the above-described laser beam (e.g., during a laser lift-off process).

As shown in FIG. 11B, the laser beam may be irradiated (e.g., locally irradiated) to the non-display area NDA. For example, the laser beam may be irradiated to the irradiated region IR of the non-display area NDA.

FIG. 11B shows that the laser beam is irradiated only to the irradiated region IR, but the laser beam may also be irradiated to the dam region DR.

During the above-described laser lift-off process, the conductive pattern CP may be heated to a certain temperature by absorbing the laser beam, and a portion of the second electrode 223 that does not overlap the conductive pattern CP may also be heated to a certain temperature by absorbing the laser beam.

The conductive pattern CP heated to a certain temperature may be separated from the insulating layer 201, and portions of the organic material layer 222o, for example, of the first functional layer 222a and the second functional layer 222c, on the conductive pattern CP and a portion of the second electrode 223 on the conductive pattern CP may be separated and removed together (or concurrently). A portion of the organic material layer 222o on the conductive pattern CP and a portion of the second electrode 223 on the conductive pattern CP may be partially vaporized through heat received from the conductive pattern CP. The conductive pattern CP is a kind of sacrificial layer, and after portions of the organic material layer 222o are removed (e.g., after the first openings 222oh are formed in the organic material layer 222o), the conductive pattern CP may be removed as illustrated in FIG. 11C.

A portion of the second electrode 223 heated to a certain temperature without overlapping the conductive pattern CP may be vaporized and removed. While a portion of the second electrode 223 is vaporized, a portion of the organic material layer 222o below the second electrode 223 may also be vaporized by receiving heat.

Heat of a laser beam may be conducted to the organic material layer 222o or the second electrode 223 on the irradiated region IR through the conductive pattern CP and a portion of the second electrode 223. As a result, portions of the organic material layer 222o on the irradiated region IR may be removed.

Meanwhile, an energy level of a laser beam irradiated to the irradiated region IR may be different depending on a location of the irradiated region IR. For example, the energy level of the laser beam irradiated to a center of the irradiated region IR may be greater than an energy level of a laser beam irradiated to outside the irradiated region IR. In this case, because heat transmitted to the conductive pattern CP outside the irradiated region IR or the second electrode 223 is less than heat transmitted to the center of the irradiated region IR, the organic material layer 222o and/or the second electrode 223 outside the irradiated region IR may not be completely removed. In a case of the second electrode 223, as described above with reference to FIG. 6B, a portion of the second electrode 223 may be torn off, and a burr may be formed. Therefore, the irradiated region IR to which a laser beam is irradiated and an area from which the organic material layer 222o and/or the second electrode 223 is/are removed (e.g., a first opening and/or a second opening) may not be exactly the same and may be different from each other.

Referring to FIG. 11C, by the above-described laser lift-off process, the organic material layer 222o may include the first openings 222oh located in the non-display area NDA, and the second electrode 223 may include the second openings 223oh located in the non-display area NDA. When the organic material layer 222o includes the first and second functional layers 222a and 222c, the first opening 222oh of the organic material layer 222o may include the opening 222ah of the first functional layer 222a and the opening 222ch of the second functional layer 222c.

FIG. 11C illustrates that the first opening 222oh and the second opening 223oh are located in the non-display area NDA, but the present disclosure is not limited thereto. Locations of the first opening 222oh and the second opening 223oh may suitably vary according to a number, a location, and/or an irradiation range of a laser beam irradiated to or directed to the conductive patterns CP. For example, a laser beam may be irradiated to the irradiated region IR and the dam region DR, and in this case, the organic material layer 222o and the second electrode 223 around (e.g., surrounding) the dam DAM may be removed.

In an embodiment, the amount of hydrogen gas, the amount of carbon gas, or a film density of each of the first area AR1 and the second area AR2 may be different. During the laser lift-off process of FIG. 11B, the first area AR1 of the insulating layer 201 may receive radiant heat due to the laser beam and conductive heat due to the conductive pattern CP. That is, unlike the second area AR2, the first area AR1 is subjected to heat conduction treatment by the conductive pattern CP.

Accordingly, the first area AR1 may have a higher film density than that of the second area AR2 by the thermal conduction treatment.

After performing the laser lift-off process, the encapsulation layer 300 and the input sensing layer 40 may be formed on the substrate 100.

The first inorganic encapsulation layer 310 of the encapsulation layer 300 may be formed to cover the substrate 100 (e.g., cover the substrate 100 as a whole). The first inorganic encapsulation layer 310 may be formed by a chemical vapor deposition method or the like. As described above, because the conductive pattern CP between adjacent dams DAM is removed, the first inorganic encapsulation layer 310 may contact (e.g., directly contact) an inorganic insulating layer therebelow, for example, the insulating layer 201.

As described above in FIG. 11B, during the laser lift-off process, the conductive pattern CP exposing a portion of the irradiated region IR of the insulating layer 201 may be used. As the conductive pattern CP exposes a portion of the irradiated region IR of the insulating layer 201, a portion of the second electrode 223 arranged on the insulating layer 201 may be irradiated (e.g., directly irradiated) with a laser beam. That is, a portion of the second electrode 223 arranged on the irradiated region IR may be heated by a laser beam and vaporized, and another portion of the second electrode 223 may be removed together (or concurrently) with the conductive pattern CP.

In this way, because a portion of the second electrode 223 is vaporized in the irradiated region IR, a size (or a length) of the edge portion 223ep of the remaining second electrode 223 may be less than a width of the irradiated region IR.

Alternatively, the size (or length) of the edge portion 223ep of the second electrode 223 may be equal to or less than a width of the first area AR1. For example, the size (or length) of the edge portion 223ep of the second electrode 223 may be about 5 μm or less.

When the conductive pattern CP exposes a portion of the irradiated region IR of the insulating layer 201, the size (or length) of the edge portion 223ep of the second electrode 223 may be reduced compared to when the conductive pattern CP covers the irradiated region IR. Accordingly, the occurrence of cracks in the first inorganic encapsulation layer 310 due to the edge portion 223ep of the second electrode 223 may be prevented or reduced.

In addition, the conductive pattern CP removed by a laser beam may remain as particles, and because a size (or an area) of the conductive pattern CP decreases, a size of the particles may also decrease.

The organic encapsulation layer 320 may be formed by applying a monomer through an inkjet method or the like and then curing the monomer, and may include a resin formed while the monomer is cured. Specific materials of the organic encapsulation layer 320 are as described above. Meanwhile, the organic encapsulation layer 320 may cover particles remaining on the second electrode 223 from among particles generated in the laser lift-off process.

The second inorganic encapsulation layer 330 may be formed on the organic encapsulation layer 320 by a chemical vapor deposition method like the first inorganic encapsulation layer 310. The second inorganic encapsulation layer 330 may contact (e.g., directly contact) the first inorganic encapsulation layer 310 in a portion of the non-display area NDA in which the organic encapsulation layer 320 is not formed and the opening area OA. For example, the second inorganic encapsulation layer 330 may contact (e.g., directly contact) the first inorganic encapsulation layer 310 between the edge 320e of the organic encapsulation layer 320 and the opening area OA, thus further reducing or preventing the possibility of moisture permeation.

Thereafter, the first sub-insulating layer 41a may be formed, and the planarization-insulating layer 47 may be formed on the first sub-insulating layer 41a. The planarization-insulating layer 47 may be formed in the non-display area NDA and the opening area OA. While the organic encapsulation layer 320 is arranged to cover the display area DA, the planarization-insulating layer 47 may not cover the display area DA. In a manufacturing process shown in FIG. 11C, the planarization-insulating layer 47 may exist or be provided only in the non-display area NDA and the open area OA.

Next, the second sub-insulating layer 41b may be formed, and the first conductive layer CML1, the second input insulating layer 43, the second conductive layer CML2, and the third input insulating layer 45 may be formed (e.g., sequentially formed).

Thereafter, when the opening area OA is cut along a cutting line SCL using a method such as laser cutting, as illustrated in FIG. 11D, the display apparatus 10 may include the opening 10H formed in the opening area OA.

Figure 13:
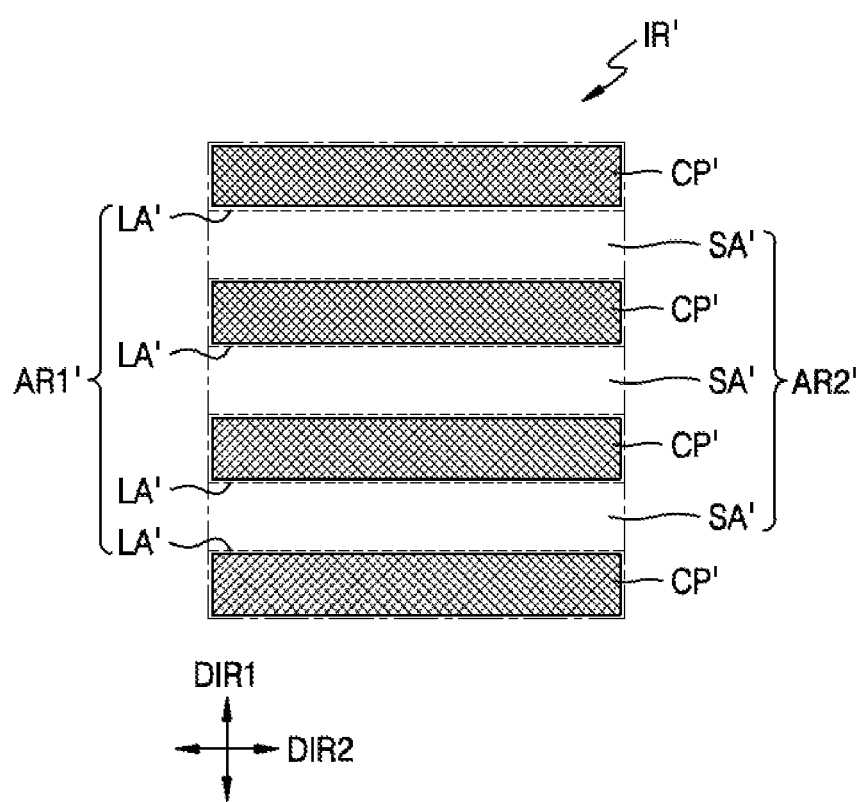
FIG. 13 is an enlarged plan view of a conductive pattern according to another embodiment.

FIG. 13 is an enlarged plan view of a conductive pattern according to another embodiment. In more detail, FIG. 13 shows a conductive pattern arranged on the irradiated region of FIG. 8.

Referring to FIG. 13, as described above with reference to FIG. 8, the irradiated region IR' may include the first area AR1' and the second area AR2'. The first area AR1' may include the plurality of line areas LA', and the second area AR2' may include the plurality of space areas SA'. In this case, the line areas LA' and the space areas SA' may extend in the second direction DIR2 and may be apart from or spaced from each other in the first direction DIR1.

Because a conductive pattern CP' may cover the first area AR1' of the insulating layer 201 and expose the second area AR2' of the insulating layer 201, as illustrated in FIG. 13, conductive patterns CP' may be formed on the line areas LA', respectively. The conductive patterns CP' may cover the line areas LA' and may expose the space areas SA', respectively.

The conductive patterns CP' may extend in the second direction DIR2 along shapes of the line areas LA', respectively, and may be apart from or spaced from each other in the first direction DIR1. In this case, when the planar shape of the irradiated region IR' is circular (e.g., a donut shape) as shown in FIG. 5A, the first direction DIR1 may be a circumferential direction, and the second direction DIR2 may be a radial direction.

FIG. 13 shows that the conductive patterns CP' extend in the second direction DIR2 but the conductive patterns CP' may extend in the third direction crossing the first direction DIR1 and the second direction DIR2.

Figure 14:
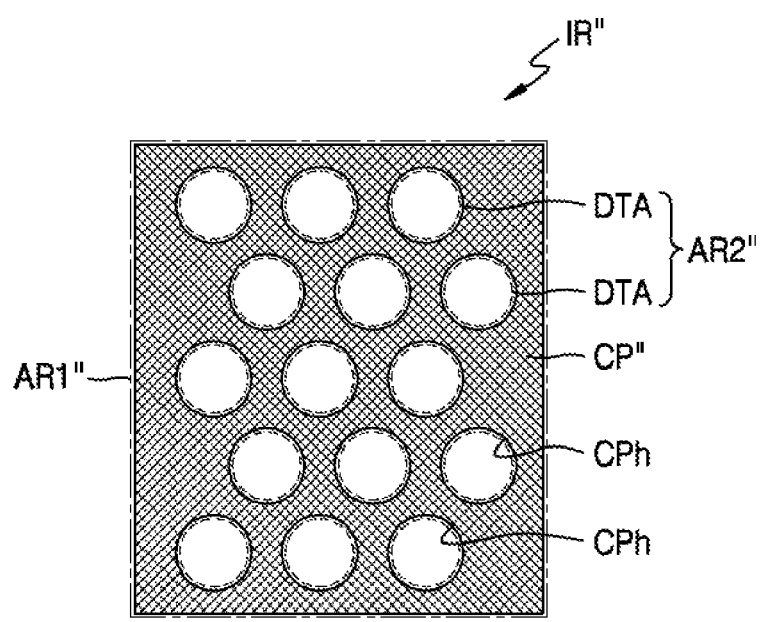
FIG. 14 is an enlarged plan view of a conductive pattern according to another embodiment.
Figure 15:
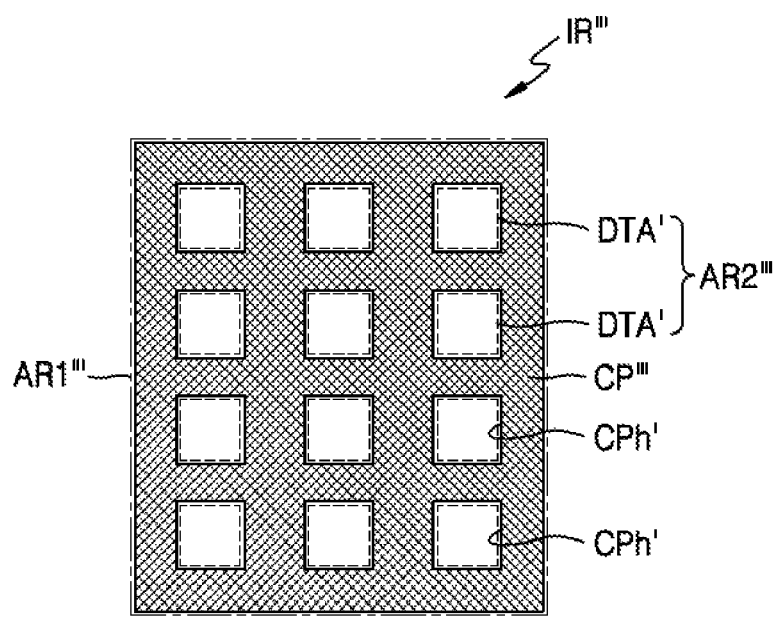
FIG. 15 is an enlarged plan view of a conductive pattern according to another embodiment.

FIGS. 14 and 15 are enlarged plan views of a conductive pattern according to another embodiment. In more detail, FIG. 14 shows a conductive pattern arranged on the irradiated region of FIG. 9, and FIG. 15 shows a conductive pattern arranged on the irradiated region of FIG. 10.

Referring to FIGS. 14 and 15, as described above in FIGS. 9 and 10, the irradiated region IR" may include a first area AR1" and second areas AR2", and the irradiated region IR'" may include the first area AR1'" and the second areas AR2'". The second areas AR2" may include the plurality of dot areas DTA surrounded by the first area AR1", and AR2'" may include the plurality of dot areas DTA' surrounded by the first area AR1'". A number of dot areas DTA and DTA' and a shape thereof may suitably vary. For example, as shown in FIG. 14, a planar shape of the dot areas DTA may be circular, or as shown in FIG. 15, a planar shape of the dot areas DTA' may be rectangular. In addition, as shown in FIG. 14, the dot areas DTA may be arranged to be shifted or offset from each other. In another example, as shown in FIG. 15, the dot areas DTA' may be arranged to be apart from or spaced from each other at regular intervals.

Because conductive pattern CP''' covers the first area AR1'' of the insulating layer 201 and conductive pattern CP'''' covers the first area AR1''' of the insulating layer 201, and the second areas AR2'' and AR2''' of the insulating layer 201 may be exposed, as shown in FIGS. 14 and 15, the conductive patterns CP''' and CP'''' may have a plurality of openings CPh and CPh' exposing the dot areas DTA and DTA', respectively. According to planar shapes of the dot areas DTA and DTA', planar shapes of the openings CPh and CPh' may be circular as illustrated in FIG. 14 or may be rectangular as illustrated in FIG. 15.

According to embodiments, moisture permeation and generation of cracks in a display apparatus including an opening may be prevented, reduced, or minimized. However, the effects described above are illustrative, and effects according to the embodiments may be described in more detail below.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing a display apparatus, the method comprising:
   preparing a substrate in which an opening area and a non-display area around at least a portion of the opening area are defined;
   forming, on the substrate, an insulating layer having an opening corresponding to the opening area and defining an irradiated region including a first area and a second area on the non-display area;
   forming a conductive pattern on the irradiated region of the insulating layer, covering the first area of the insulating layer, and exposing the second area of the insulating layer;
   forming an organic material layer on the insulating layer and the conductive pattern;
   forming an electrode layer on the organic material layer; and
   removing, by irradiating a laser beam to the irradiated region of the insulating layer, the conductive pattern, the organic material layer on the irradiated region, and the electrode layer on the irradiated region.

2. The method of claim 1, wherein the first area comprises a plurality of line areas extending in a first direction and spaced from each other in a second direction,
   wherein the second area comprises a plurality of space areas extending in the first direction and spaced from each other in the second direction, and
   wherein the plurality of line areas and the plurality of space areas are alternately arranged with each other along the second direction.

3. The method of claim 2, wherein the irradiated region has a closed curve shape extending in the first direction in a plan view.

4. The method of claim 3, wherein a planar shape of the irradiated region is circular,
   wherein the first direction is a circumferential direction, and
   wherein the second direction is a radial direction.

5. The method of claim 2, wherein the irradiated region has a closed curve shape extending in the second direction in a plan view.

6. The method of claim 5, wherein a planar shape of the irradiated region is circular,
   wherein the second direction is a circumferential direction, and
   wherein the first direction is a radial direction.

7. The method of claim 1, wherein the second area comprises a plurality of dot areas surrounded by the first area, and
   wherein the conductive pattern has a plurality of openings exposing the plurality of dot areas.

8. The method of claim 1, wherein a display area is further defined on the substrate,
   wherein the non-display area is between the opening area and the display area, and
   wherein the method further comprises:
   forming, on the insulating layer, a pixel circuit comprising a transistor and a capacitor;
   forming a pixel electrode on the display area and electrically connected to the pixel circuit; and
   forming the organic material layer on the pixel electrode.

9. The method of claim 8, wherein the pixel electrode and the conductive pattern comprise a same conductive material by a same process.

10. The method of claim 1, wherein the irradiating the laser beam to the irradiated region of the insulating layer comprises:
    forming, in the organic material layer, a first opening exposing at least a portion of the insulating layer; and
    forming, in the electrode layer, a second opening corresponding to the first opening.

11. The method of claim 1, further comprising heat-treating the first area of the insulating layer.

12. The method of claim 11, wherein the irradiating the laser beam to the irradiated region of the insulating layer is performed concurrently with the heat-treating of the first area of the insulating layer.

13. The method of claim 1, further comprising forming, on the electrode layer, an encapsulation layer comprising an inorganic encapsulation layer and an organic encapsulation layer.

14. The method of claim 13, wherein the inorganic encapsulation layer contacts an upper surface of the irradiated region of the insulating layer and a sidewall of the organic material layer formed by removing the organic material layer on the irradiated region.

15. The method of claim 1, further comprising forming a plurality of dams on the non-display area of the substrate,
    wherein the conductive pattern is arranged between the plurality of dams.

16. A display apparatus comprising:
    a substrate having an opening area, a display area around at least a portion of the opening area, and a non-display area between the opening area and the display area;
    an insulating layer on the substrate, having an opening corresponding to the opening area, and defining a plurality of irradiated regions and a plurality of dam regions on the non-display area;
    an organic material layer on the insulating layer and exposing at least a portion of each of the plurality of irradiated regions of the insulating layer; and a plurality of dams respectively arranged on the plurality of dam regions of the insulating layer, wherein the plurality of irradiated regions and the plurality of dam regions extend in a first direction and are alternately arranged with each other along a second direction crossing the first direction, wherein each of the plurality of irradiated regions comprises a first area and a second area, and wherein the first area has a higher density of film than the second area by thermal conduction treatment.

17. The display apparatus of claim 16, wherein each of the plurality of irradiated regions and the plurality of dam regions has a closed curve shape extending in the first direction in a plan view.

18. The display apparatus of claim 16, wherein the first area comprises a plurality of line areas extending in a third direction and spaced from each other in a fourth direction crossing the third direction, wherein the second area comprises a plurality of space areas extending in the third direction and spaced from each other in the fourth direction, and wherein the plurality of line areas and the plurality of space areas are alternately arranged with each other along the fourth direction.

19. The display apparatus of claim 16, wherein the second area comprises a plurality of dot areas surrounded by the first area.

20. The display apparatus of claim 16, wherein the insulating layer includes a trench corresponding to the first area.

* * * * *